(12) United States Patent
Togashi et al.

(10) Patent No.: US 7,171,592 B2
(45) Date of Patent: Jan. 30, 2007

(54) SELF-TESTING CIRCUIT IN SEMICONDUCTOR MEMORY DEVICE

(75) Inventors: Kenji Togashi, Kawasaki (JP); Morihiko Hamada, Kawasaki (JP); Shigekazu Aoki, Kawasaki (JP); Katsumi Shigenobu, Kawasaki (JP); Yukio Saka, Kawasaki (JP); Yoshikazu Arisaka, Kawasaki (JP); Toyoji Sawada, Kawasaki (JP); Tadashi Asai, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 536 days.

(21) Appl. No.: 10/360,862

(22) Filed: Feb. 10, 2003

(65) Prior Publication Data

US 2003/0177415 A1    Sep. 18, 2003

(30) Foreign Application Priority Data

Mar. 18, 2002    (JP) ............................. 2002-074963

(51) Int. Cl.
G06F 11/00    (2006.01)
(52) U.S. Cl. ..................... 714/54; 714/711; 714/723
(58) Field of Classification Search ................ 714/719, 714/54, 42
See application file for complete search history.

(56) References Cited

U.S. PATENT DOCUMENTS 5,477,492 A * 12/1995 Ohsaki et al. ............. 365/200
6,343,366 B1 * 1/2002 Okitaka ...................... 714/733
6,539,506 B1 * 3/2003 Lammers et al. ........... 714/719
6,643,807 B1 * 11/2003 Heaslip et al. .............. 714/719

FOREIGN PATENT DOCUMENTS

| JP | 03-116497 | 5/1991 |
|----|-----------|--------|
| JP | 05-205497 | 8/1993 |
| JP | 09-311824 | 12/1997 |
| JP | 11-238393 | 8/1999 |
| JP | 2000-030483 | 1/2000 |
| JP | 2000-311497 | 11/2000 |

* cited by examiner

Primary Examiner—Scott Baderman
Assistant Examiner—Joshua Lohn
(74) Attorney, Agent, or Firm—Arent Fox PLLC

(57) ABSTRACT

A semiconductor memory device includes a self-testing circuit and a self-redundancy circuit with simple structures. The self-testing circuit includes a comparison circuit which compares write data with read data with respect to normal memory blocks and redundant memory blocks, and a decision circuit which decides if the semiconductor memory device is good or defective based on the plurality of comparison result signals. A signal transfer and holding circuit is connected between the comparison circuit and the decision circuit to transfer the plurality of comparison result signals to the decision circuit and to supply the plurality of comparison result signals to the self-redundancy circuit as a test result.

19 Claims, 14 Drawing Sheets

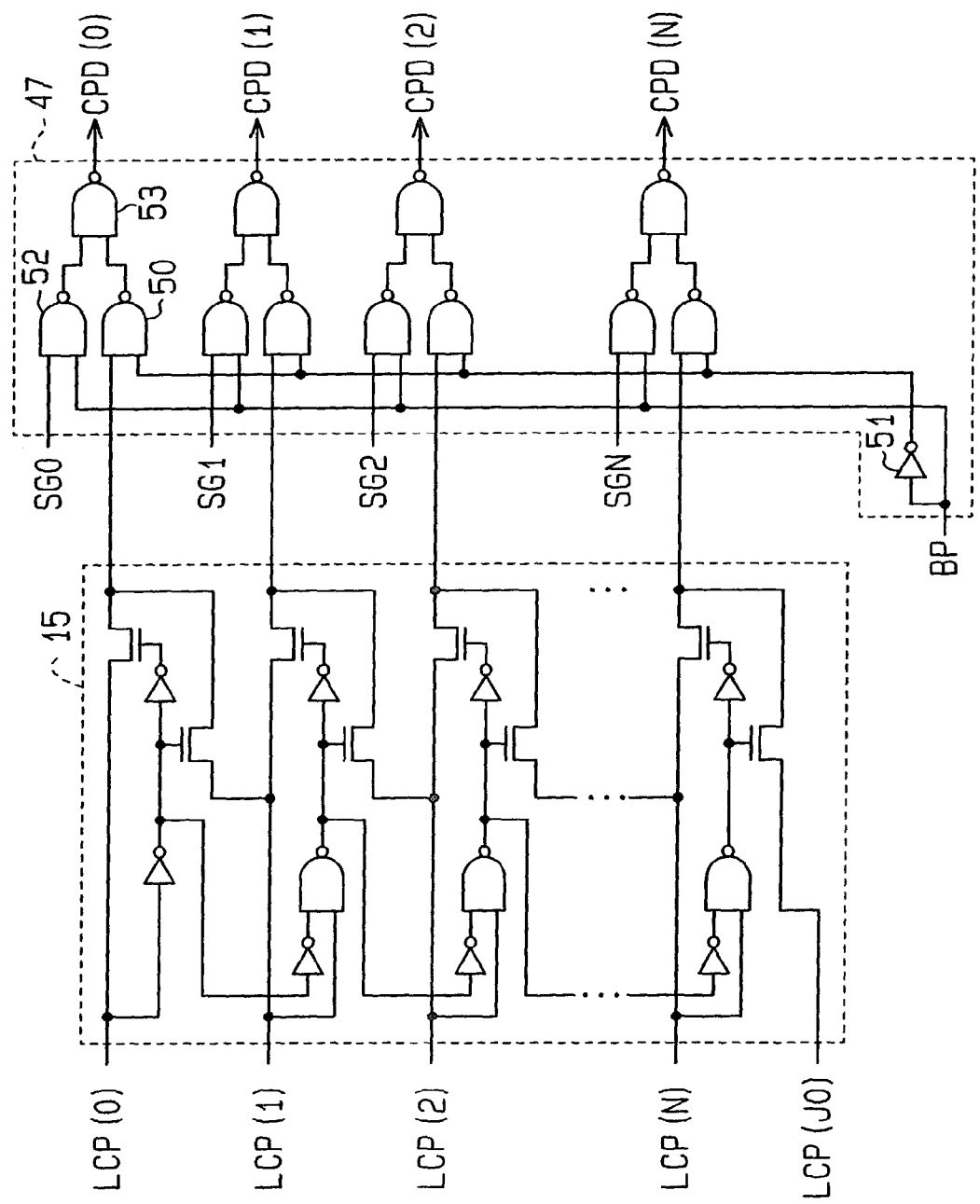

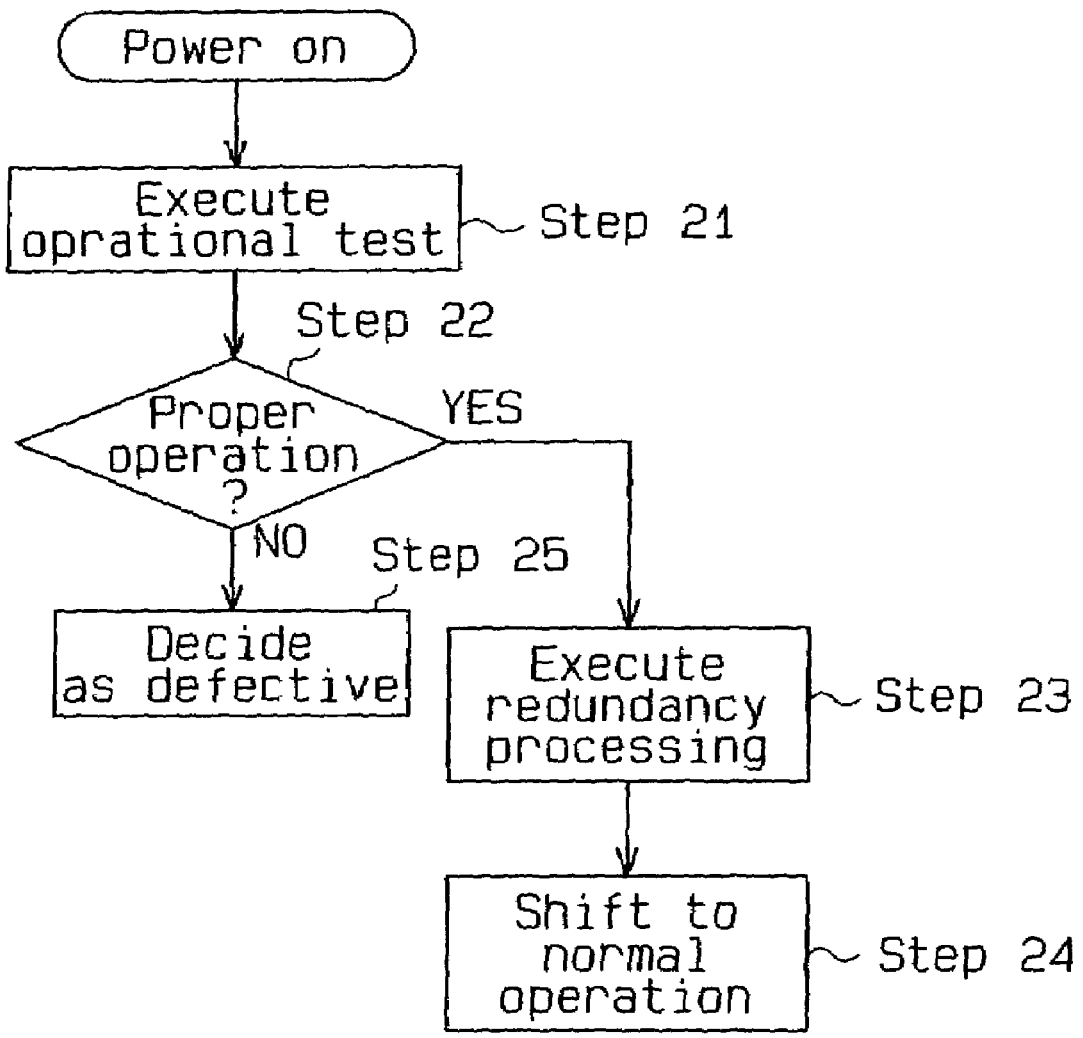

SELF-TESTING CIRCUIT IN SEMICONDUCTOR MEMORY DEVICE

CROSS-REFERENCE TO RELATED APPLICATIONS

This application is based upon and claims the benefit of priority from the prior Japanese Patent Application No. 2002-074963, filed on Mar. 18, 2002, the entire contents of which are incorporated herein by reference.

BACKGROUND OF THE INVENTION

The present invention relates generally to a semiconductor memory device having a self-testing capability, and, more particularly, pertains to a semiconductor memory device having a self-testing capability based on the BIST (Built-In Self-Test) technology and a self-redundancy capability.

Before a plurality of semiconductor chips formed on a wafer are separated by dicing, the semiconductor chips in a wafer state are subjected to an operational test by using an external testing device. As the recent semiconductor memory devices have faster operation speeds and larger capacities, a test chip called BOST (Built-Off-chip Self-Test), or BIST (Built-In Self-Test) which is a self-testing circuit formed in advance in each chip is used in an operational test in order to assist such an external testing device.

A semiconductor memory device equipped with not only a self-testing circuit but also a self-redundancy circuit has also been proposed. When a memory block which contains a defective cell is detected in an operational test, the self-redundancy circuit switches access from the memory block to a redundant memory block.

Semiconductor memory devices which have a BIST-based self-testing capability and a self-redundancy capability are disclosed in the following publications.

Japanese Laid-Open Patent Publication No. 11-238393 discloses a memory device which stores the address of a defective cell, when detected in the BIST-based operational test, into a register mounted on a chip. In the normal operation of the memory device, when access is made to a defective cell, the access to the defective cell is switched to a redundant cell based on the address stored in the register.

Japanese Laid-Open Patent Publication Nos. 3-116497, 2000-311497 and 9-311824 and Japanese Patent No. 3006303 disclose memory devices in each of which has a self redundancy capability provided in a chip.

In a case where a self-redundancy capability is provided in a chip, however, a memory unit for storing failure information, a defect address generator, an address converter or a register should be provided, beside a BIST circuit, in a chip. This undesirably increases the circuit area of the semiconductor chip. In addition, the interface circuit which is provided between the circuit that achieves the self-redundancy capability and other circuits becomes complicated.

Japanese Unexamined Patent Publication No. 2000-30483 discloses a memory device having a data conversion unit provided outside a chip. When a defective cell is detected in an operational test, the data conversion unit receives address data of the defective cell and generates redundant address data. The memory device performs a redundancy operation in accordance with the redundant address data. The provision of the data conversion unit outside a chip however inevitably increases the cost for the memory device.

SUMMARY OF THE INVENTION

In a first aspect of the present invention, a testing circuit for self-testing a memory cell array is provided. The testing circuit includes a comparison circuit for comparing write data to the memory cell array with read data from the memory cell array and generating a comparison result signal, a decision circuit for deciding if the memory cell array is good or defective based on the comparison result signal from the comparison circuit, and a signal transfer and holding circuit, connected between the comparison circuit and the decision circuit, for transferring the comparison result signal to the decision circuit and holding the comparison result signal.

In a second aspect of the present invention, a testing circuit for self-testing a semiconductor memory device is provided. The semiconductor memory device includes a normal memory block and a redundant memory block, each of which performs data writing and data reading. The testing circuit includes a plurality of comparison circuits for each comparing data read from an associated memory block with write data to the associated memory block and generating a comparison result signal and a plurality of holding circuits for each holding the comparison result signal from the associated comparison circuit. A first switch circuit is connected between the plurality of comparison circuits and the plurality of holding circuits to receive the plurality of comparison result signals from the plurality of holding circuits and supply a new comparison result signal to be supplied to at least one holding circuit to another holding circuit excluding the at least one holding circuit, when at least one comparison result signal indicates write data not matching with read data, such that the at least one comparison result signal is held in at least one associated holding circuit. A second switch circuit is connected to the plurality of holding circuits to selectively output the plurality of comparison result signals held in the plurality of holding circuits.

In a third aspect of the present invention, a testing circuit for self-testing a semiconductor memory device is provided. The semiconductor memory device includes a normal memory block and a redundant memory block, each of which performs data writing and data reading. The testing circuit includes a plurality of comparison circuits for each comparing data read from an associated memory block with write data to the associated memory block and generating a comparison result signal and a plurality of holding circuits for each holding the comparison result signal from the associated comparison circuit. A first bypass circuit is connected between the plurality of comparison circuits and the plurality of holding circuits to receive the plurality of comparison result signals from the plurality of comparison circuits and selectively supply the plurality of comparison result signals to the plurality of holding circuits in response to a control signal. A switch circuit is connected to the plurality of holding circuits to selectively output the plurality of comparison result signals held in the plurality of holding circuits. A second bypass circuit is connected to the switch circuit and the plurality of comparison circuits to transfer the plurality of comparison result signals to the plurality of comparison circuits or the plurality of comparison result signals output from the switch circuit to the decision circuit in response to the control signal.

In a fourth aspect of the present invention, a semiconductor memory device is provided. The memory device includes a memory cell array including a normal memory block and a redundant memory block, a self-testing circuit for testing each of the memory blocks, and a redundancy circuit for switching the normal memory block, if found defective based on a test result from the self-testing circuit, to the redundant memory block. The self-testing circuit includes a comparison circuit for comparing write data to the normal memory block with read data from the normal memory block, comparing write data to the redundant memory block with read data from the redundant memory block, and generating a plurality of comparison result signals. A decision circuit decides if the memory cell array is good or defective based on the plurality of comparison result signals from the comparison circuit. A signal transfer and holding circuit is connected between the comparison circuit and the decision circuit to transfer the plurality of comparison result signals to the decision circuit and supply the plurality of comparison result signals to the redundancy circuit as a test result.

In a fifth aspect of the present invention, a semiconductor memory device is provided. The memory device includes a normal memory block and a redundant memory block, each of which performs data writing and data reading, a plurality of comparison circuits for each comparing data read from an associated memory block with write data to the associated memory block and generating a comparison result signal, a plurality of holding circuits for each holding the comparison result signal from the associated comparison circuit, and a switch circuit, connected to the plurality of holding circuits, for selectively transferring the plurality of comparison result signals held in the plurality of holding circuits.

In a six aspect of the present invention, a method for performing self-testing of a semiconductor memory device is provided. The semiconductor memory device includes a normal memory block and a redundant memory block, each of which performs data writing and data reading. The method includes comparing data read from each memory block with write data to each memory block and generating a plurality of comparison result signals, transferring the plurality of comparison result signals to a decision circuit which decides if the semiconductor memory device is good or defective, and holding the plurality of comparison result signals.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 16 is a schematic circuit diagram of a second switch circuit and a second bypass circuit in the data comparison circuit of FIG. 12; and FIG. 17 is a flowchart for explaining the operation of the semiconductor memory device according to the third embodiment of the present invention.

DETAILED DESCRIPTION OF THE PREFERRED EMBODIMENTS

Figure 1:
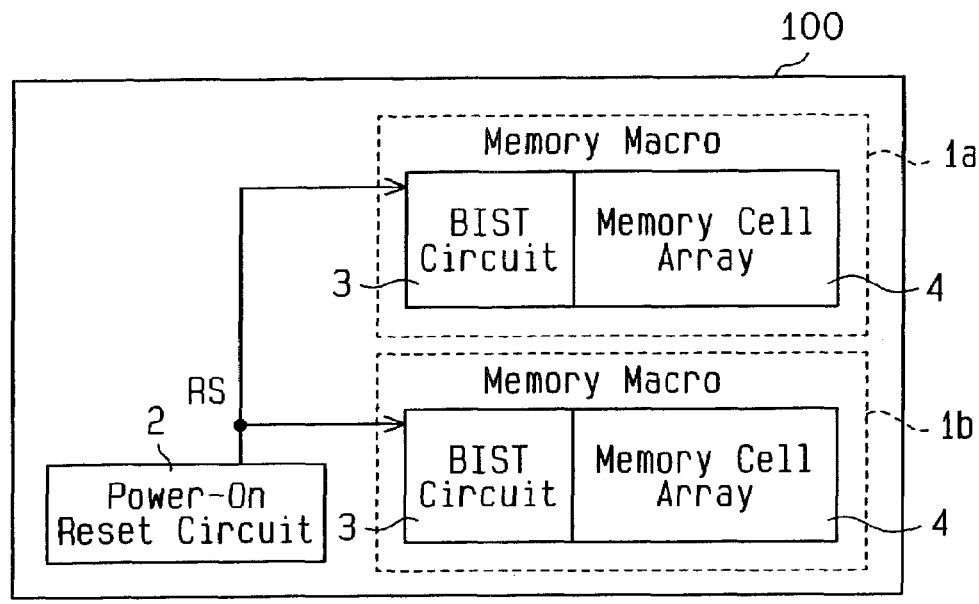
FIG. 1 is a schematic block diagram of a semiconductor memory device according to a first embodiment of the present invention.

In the drawings, like numerals are used for like elements throughout.

A semiconductor memory device according to a first embodiment of the present invention will be described below referring to the accompanying drawings.

As shown in FIG. 1, an Application Specific Integrated Circuit (ASIC) semiconductor chip 100, or a semiconductor memory device, includes a plurality of memory macros 1$a$ and 1$b$ and a power-on reset circuit 2.

Each of the memory macros 1$a$ and 1$b$ includes a BIST circuit (self-testing circuit) 3 and a memory cell array 4. The power-on reset circuit 2 generates a reset signal RS when powered on. The BIST circuit 3 starts performing an operational test on the memory cell array 4 in response to the reset signal RS.

Figure 2:
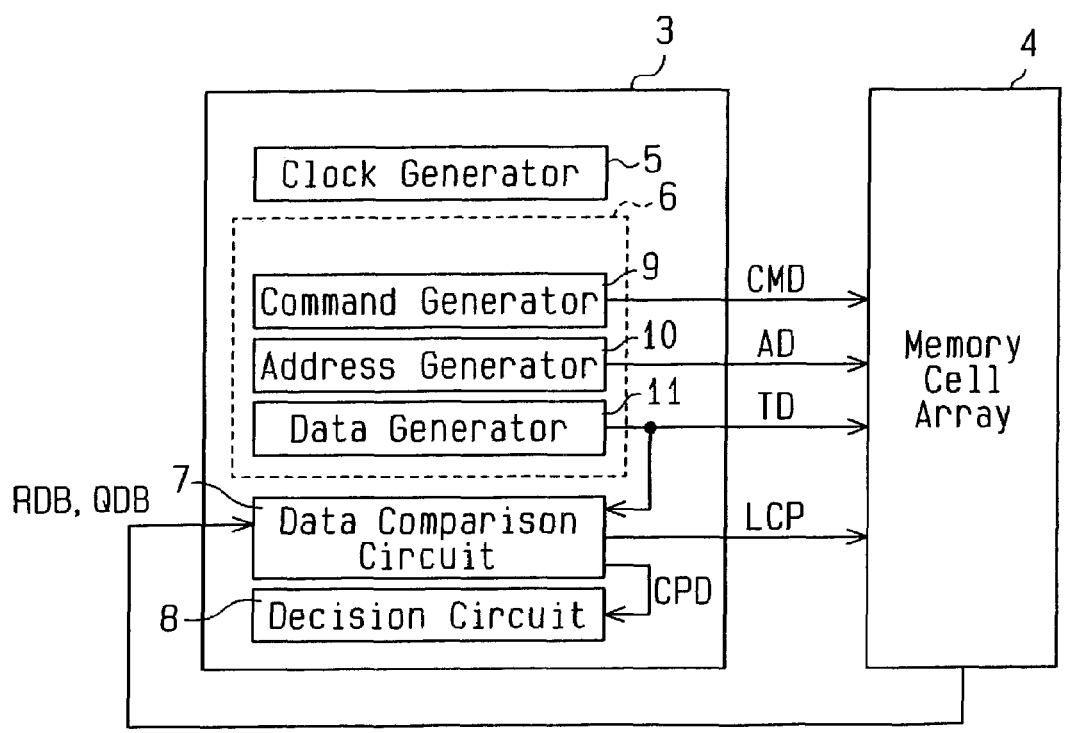
FIG. 2 is a schematic block diagram of a BIST circuit in the semiconductor memory device of FIG. 1.

As shown in FIG. 2, the BIST circuit 3 includes a clock generator 5, a pattern generator 6, a data comparison circuit 7 and a decision circuit 8.

The clock generator 5 generates a clock signal to be used in the operational test and supplies the clock signal to the pattern generator 6.

The pattern generator 6 includes a command generator 9, an address generator 10 and a data generator 11. The command generator 9 generates a command signal CMD for performing the operational test and supplies the command signal CMD to the memory cell array 4.

The address generator 10 generates an address signal AD to be used in the operational test and supplies the address signal AD to the memory cell array 4. The data generator 11 generates a write data signal TD or expected value data to be used in the operational test and supplies the write data signal TD to the memory cell array 4 and the data comparison circuit 7.

The data comparison circuit 7 compares read data signals RDB and QDB, output from the memory cell array 4, with the write data signal TD, latches the comparison result and supplies a latched data signal LCP to the memory cell array 4.

Figure 3:
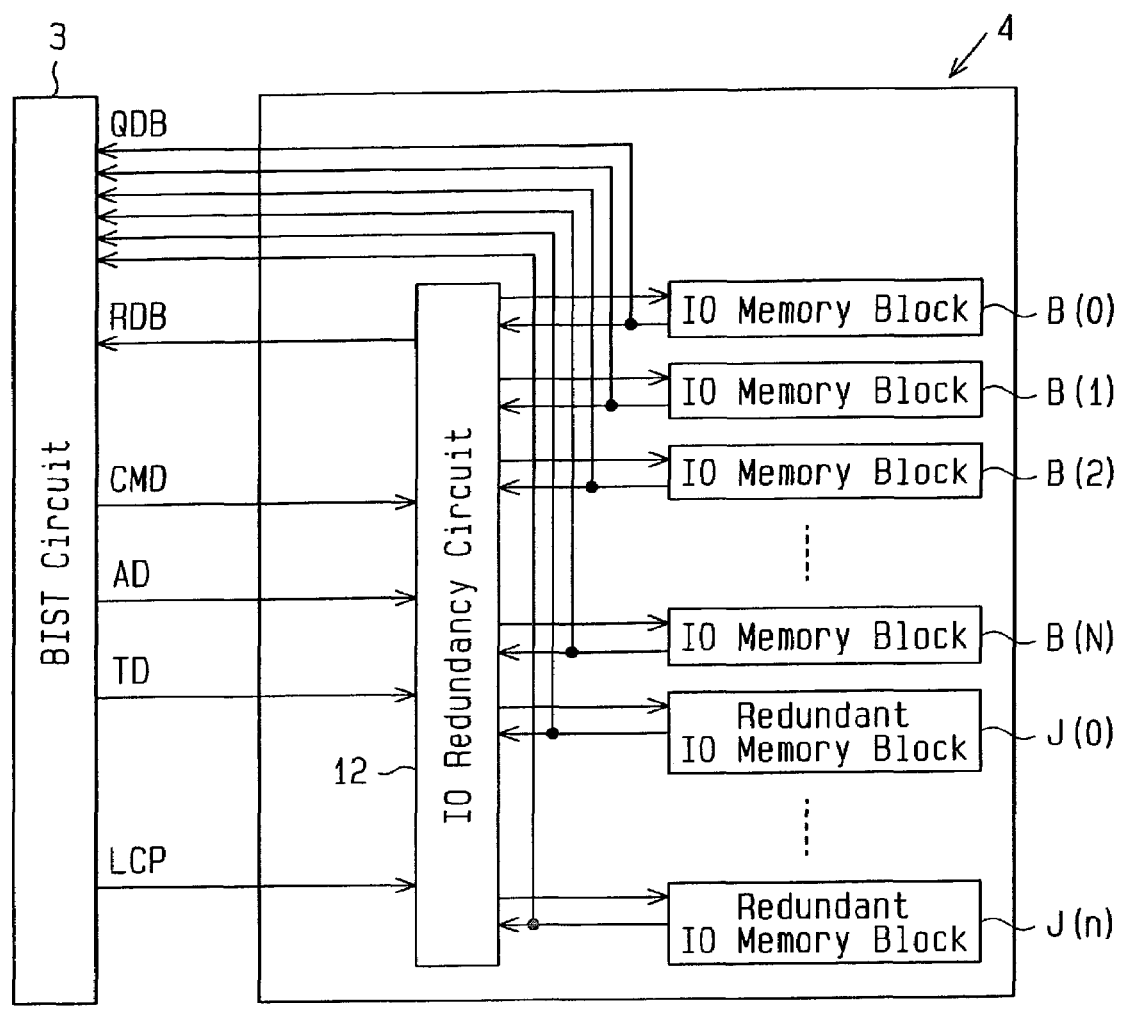
FIG. 3 is a schematic block diagram of a memory cell array in the semiconductor memory device of FIG. 1.

As shown in FIG. 3, the memory cell array 4 includes N+1 normal IO memory blocks B(0) to B(N), n+1 redundant IO memory blocks J(0) to J(n) and an IO redundancy circuit 12. The number of the redundant IO memory blocks J(0) to J(n) is smaller than the number of the IO memory blocks B(0) to B(N).

The IO redundancy circuit 12 receives the latched data signal LCP from the data comparison circuit 7 and selects N+1 memory blocks from the IO memory blocks B(0) to B(N) and the redundant IO memory blocks J(0) to J(n). The IO redundancy circuit 12 receives the command signal CMD, the address signal AD and the write data signal TD from the pattern generator 6 and supplies those signals to the selected memory blocks.

The IO redundancy circuit 12 receives the read data signals RDB read from the selected memory blocks and supplies the read data signals RDB to the data comparison circuit 7. The read data signals QDB are supplied directly to the data comparison circuit 7 from the IO memory blocks B(0) to B(N) and the redundant IO memory blocks J(0) to J(n) without going through the IO redundancy circuit 12.

Figure 4:
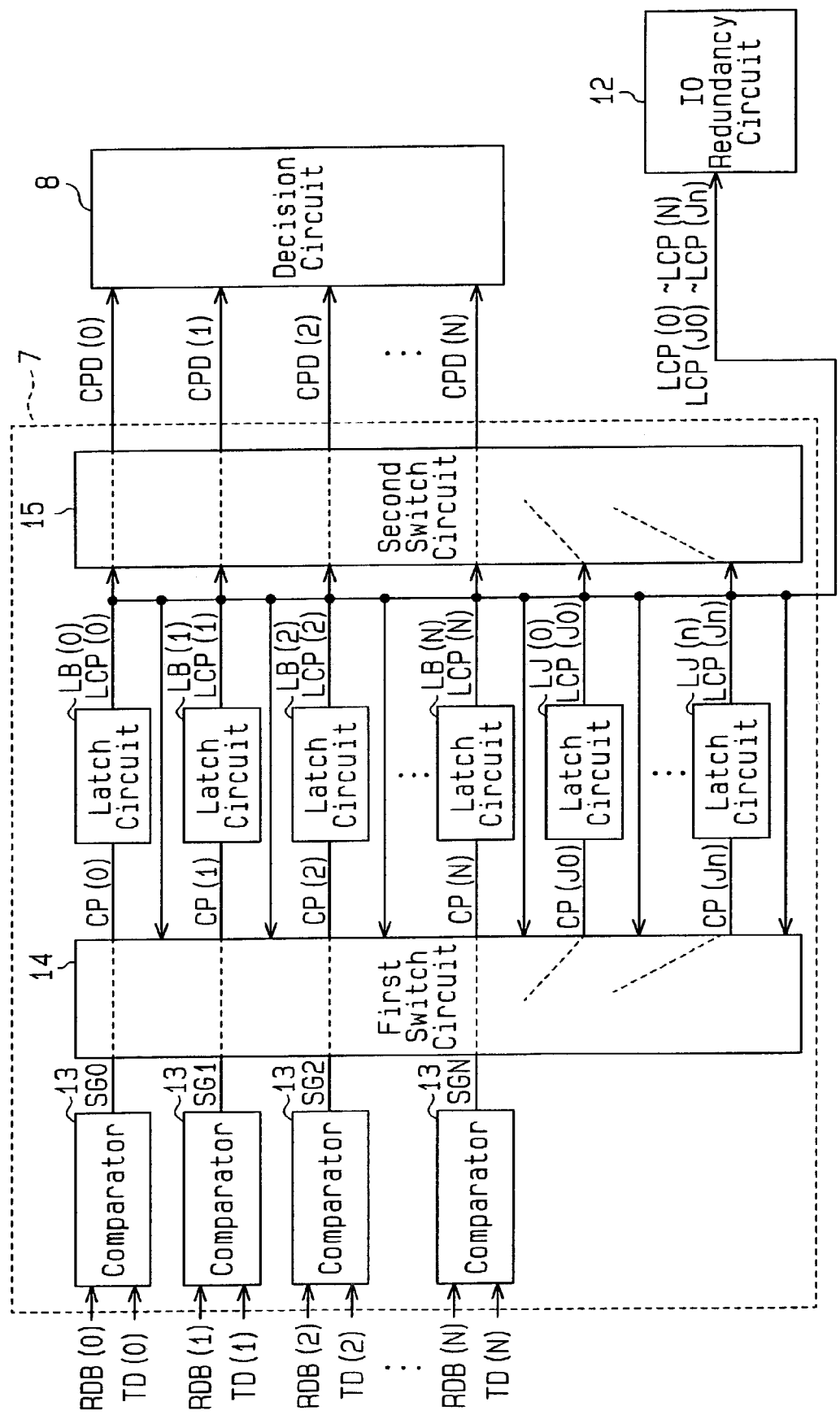
FIG. 4 is a schematic block diagram of a data comparison circuit in the BIST circuit of FIG. 2.

As shown in FIG. 4, the data comparison circuit 7 includes a plurality of comparators 13 each of which receives read data signals RDB(0) to RDB(N) from N+1 memory blocks. The N+1 memory blocks are selected from the IO memory blocks B(0) to B(N) and the redundant IO memory blocks J(0) to J(n). The comparators 13 receive write data signals TD(0) to TD(N) as expected value data.

The individual comparators 13 respectively compare the read data signals RDB(0) to RDB(N) with the expected value data signals TD(0) to TD(N) and supplies comparison results SG0 to SGN representing the comparison results to a first switch circuit 14. Connected to the first switch circuit 14 are latch circuits LB(0) to LB(N) equal in number to the IO memory blocks B(0) to B(N) and latch circuits LJ(0) to LJ(n) equal in number to the redundant IO memory blocks J(0) to J(n).

The first switch circuit 14 supplies output signals CP(0) to CP(N) and CP(J0) to CP(Jn), including the comparison results SG0 to SGN from the N+1 comparators 13, to the latch circuits LB(0) to LB(N) and LJ(0) to LJ(n). The latch circuits LB(0) to LB(N) latch the received output signals and supplies latched data signals LCP(0) to LCP(N) to the IO redundancy circuit 12, the first switch circuit 14 and a second switch circuit 15. The latch circuits LJ(0) to LJ(N) latch the received output signals and supplies latched data signals LCP(J0) to LCP(JN) to the IO redundancy circuit 12 and the first and second switch circuits 14 and 15 of the memory cell array 4.

The second switch circuit 15 receives the latched data signals corresponding to the comparison results SG0 to SGN from the first switch circuit 14 and generates comparison data signals CPD(0) to CPD(N).

Figure 5:
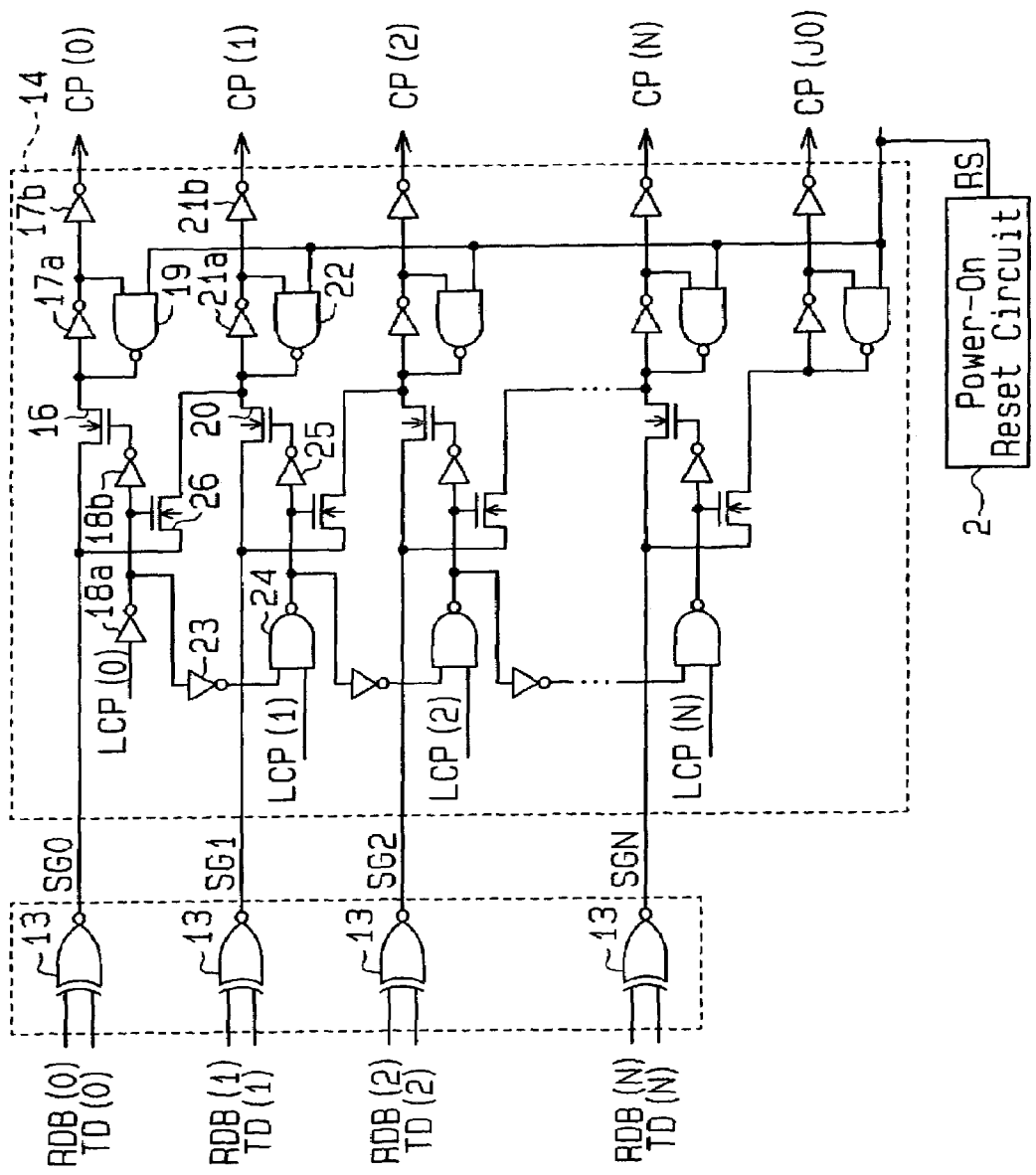
FIG. 5 is a schematic circuit diagram of a comparator and a first switch circuit in the data comparison circuit of FIG. 4.

The comparator 13 and the first switch circuit 14 will be discussed below with reference to FIG. 5. In this example, the first switch circuit 14 is designed for the memory cell array 4 that has a single redundant IO memory block.

Each comparator 13 comprises an ENOR gate. When the read data signals RDB(0) to RDB(N) and the associated expected value data signals TD(0) to TD(N) are both H levels or L levels, the comparators 13 generate H-level comparison results SG0 to SGN. When the read data signals RDB(0) to RDB(N) do not coincide with the associated expected value data signals TD(0) to TD(N), the comparators 13 generate L-level comparison results SG0 to SGN.

In the first switch circuit 14, the comparison result SG0 is output as an output signal CP(0) via a transfer transistor 16 comprised of an N-channel MOS transistor and two stages of inverter circuits 17*a* and 17*b*. The latched data signal LCP(0) from the latch circuit LB(0) is supplied to the gate of the transfer transistor 16 via inverter circuits 18*a* and 18*b*. Therefore, when the latched data signal LCP(0) goes to an H level, the transfer transistor 16 is turned on and the output signal CP(0) is output in phase with the comparison result SG0.

The output signal of the inverter circuit 17*a* is supplied to the first input terminal of a NAND gate 19 whose second input terminal is supplied with the reset signal RS from the power-on reset circuit 2. The output signal of the NAND gate 19 is supplied to the inverter circuit 17*a*.

The reset signal RS is a pulse signal which holds an L level for a predetermined time when power is provided. When power is provided, therefore, the inverter circuit 17*a* and the NAND gate 19 operate as a latch circuit and latch the output signal CP(0) at an H level.

The comparison result SG1 is output as an output signal CP(1) via a transfer transistor 20 and inverter circuits 21*a* and 21*b*. The output signal of the inverter circuit 21*a* is supplied to the first input terminal of a NAND gate 22 whose second input terminal is supplied with the reset signal RS. The output signal of the NAND gate 22 is supplied to the inverter circuit 21*a*. When power is provided, therefore, the inverter circuit 21*a* and the NAND gate 22 operate as a latch circuit and latch the output signal CP(1) at an H level.

The output signal of the inverter circuit 18*a* is supplied to the first input terminal of a NAND gate 24 via an inverter circuit 23. The second input terminal of the NAND gate 24 is supplied with the latched data signal LCP(1). The output signal of the NAND gate 24 is supplied to the gate of the transfer transistor 20 via an inverter circuit 25. The comparison result SG0 is also supplied to the inverter circuit 21*a* via a transfer transistor 26.

The comparison results SG2 to SGN, like the comparison result SG1, are supplied to the associated circuits.

When all of the latched data signals LCP(0) to LCP(N) have H levels, the transfer transistors including the transfer transistors 16 and 20 in the first switch circuit 14 are turned on and the comparison results SG0 to SGN are output as the output signals CP(0) to CP(N).

When the latched data signal LCP(0) has an L level, for example, the transfer transistors 16 and 20 are turned off and the transfer transistor 26 is turned on. Then, the comparison result SG0 is supplied to the inverter circuit 21*a* via the transfer transistor 26 and the comparison result SG0 is output as the output signal CP(1). Likewise, the comparison result SG1 is output as the output signal CP(2), the comparison result SG2 is output as the output signal CP(3), and the comparison result SGN is output as the output signal CP(J0).

By shifting the output terminals one-by-one this way, the comparison results SG0 to SGN are output as the output signals CP(1) to CP(J0).

Figure 6:
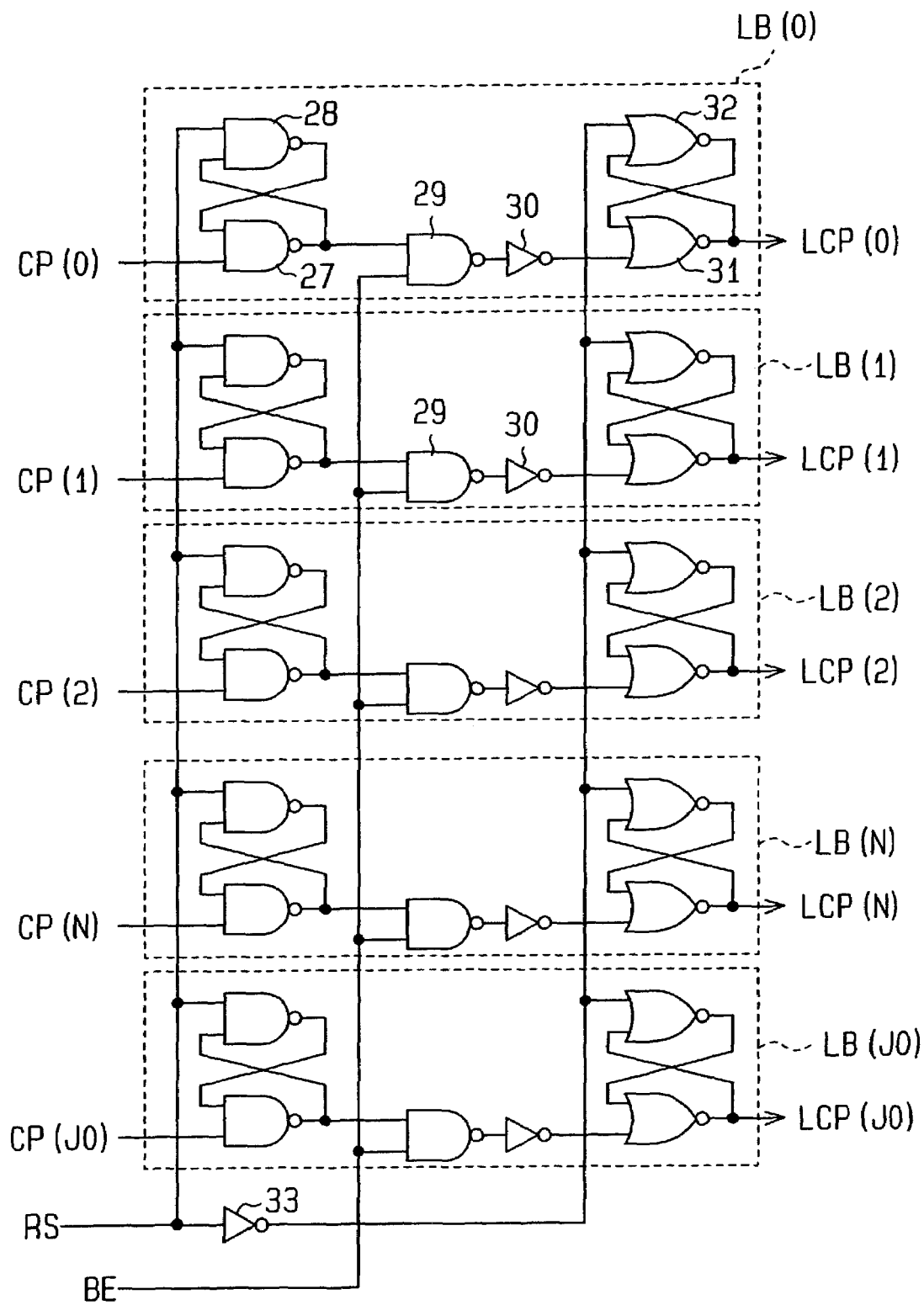
FIG. 6 is a schematic circuit diagram of a latch circuit in the data comparison circuit of FIG. 4.

FIG. 6 shows the latch circuits LB(0) to LB(N) and latch circuits LJ(0) to LJ(n). The latch circuits are provided in association with the memory cell array 4 that has a single redundant IO memory block J(0). The first switch circuit 14 outputs the output signals CP(0) to CP(N) and CP(J0) greater in number by one than the comparison results SG0 to SGN in association with the latch circuits LB(0) to LB(N) and LJ(0).

In the latch circuit LB(0), the output signal CP(0) of the first switch circuit 14 is supplied to the first input terminal of a NAND gate 27 whose output signal is supplied to the first input terminal of a NAND gate 28. The output signal of the NAND gate 28 is supplied to the second input terminal of the NAND gate 27. The reset signal RS is supplied to the second input terminal of the NAND gate 28.

The output signal of the NAND gate 27 is supplied to the first input terminal of a NAND gate 29 whose second input terminal is supplied with a BIST end signal BE. The BIST end signal BE is a pulse signal which goes to an H level every time the BIST circuit 3 finishes a single operational test (i.e., a write operation test and read operation test on all of the memory cells of all of the memory blocks B(0) to B(N) and J(0) to J(n)).

When the output signal of the NAND gate 27 is at an L level, the output signal of the NAND gate 29 is set to an H level irrespective of the level of the BIST end signal BE. When the output signal of the NAND gate 27 is at an H level, the output signal of the NAND gate 29 is set to an L level in response to the input of the BIST end signal BE.

The output signal of the NAND gate 29 is supplied to the first input terminal of a NOR gate 31 via an inverter circuit 30. The output signal of the NOR gate 31 is output as the latched data signal LCP(0) and is supplied to the first input terminal of a NOR gate 32. The reset signal RS is supplied to the second input terminal of the NOR gate 32 via an inverter circuit 33. The output signal of the NOR gate 32 is supplied to the second input terminal of the NOR gate 31.

When power is provided, the reset signal RS is held at an L level for a predetermined time and the output signal of the NAND gate 28 is set to an H level in the latch circuit LB(0). As the output signal CP(0) of the first switch circuit 14 is reset to an H level at this time, the output signal of the NAND gate 27 is set to an L level. Then, the output signal of the NAND gate 29 rises to an H level and the output signal of the inverter circuit 30 falls to an L level. The output signal of the NOR gate 32 is set to an L level in accordance with the reset signal RS. When the reset signal RS is supplied, therefore, the latched data signal LCP(0) is reset to an H level.

If the output signal CP(0) is kept at the H level in this reset state, the latched data signal LCP(0) is kept at the H level. When the output signal CP(0) falls to an L level, the output signal of the NAND gate 27 rises to an H level. As the reset signal RS is set back to the H level at this time, the output signal of the NAND gate 28 falls to an L level and the output signal of the NAND gate 27 is latched at an H level. The latched signal of the NAND gate 27 will be kept at the H level even if the output signal CP(0) returns to the H level thereafter.

When the BIST end signal BE rises to an H level, the output signal of the NAND gate 29 falls to an L level and the output signal of the inverter circuit 30 rises to an H level. This causes the output signal of the NOR gate 31 to fall to an L level. At this time, the reset signal RS is at an H level and the output signal of the inverter circuit 33 is at an L level, the output signal of the NOR gate 32 rises to an H level and the latched data signal LCP(0) is latched to an L level. Therefore, when the L-level output signal CP(0) is supplied, the latched data signal LCP(0) is set to an L level.

Each of the latch circuits LB(1) to LB(N) operates in the same way as the latch circuit LB(0).

Figure 7:
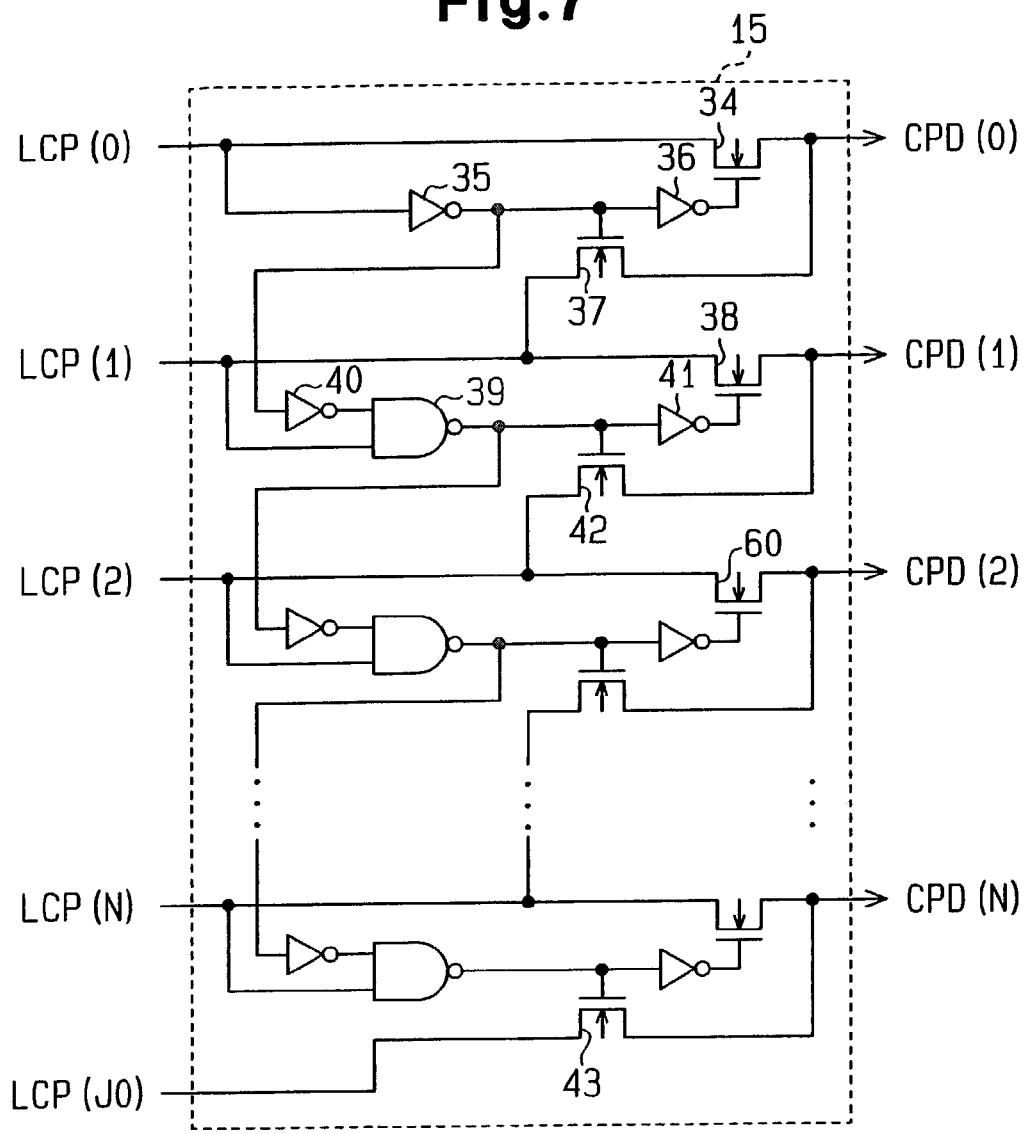
FIG. 7 is a schematic circuit diagram of a second switch circuit in the data comparison circuit of FIG. 4.

FIG. 7 shows the second switch circuit 15 which receives the latched data signals LCP(0) to LCP(N) and LCP(J0) of the latch circuits LB(0) to LB(N) and LJ(0).

The latched data signal LCP(0) is output as a comparison data signal CPD(0) via a transfer transistor 34. The latched data signal LCP(0) is also supplied to the gate of the transfer transistor 34 via inverter circuits 35 and 36.

The latched data signal LCP(1) is output as a comparison data signal CPD(0) via a transfer transistor 37 or output as a comparison data signal CPD(1) via a transfer transistor 38. The output signal of the inverter circuit 35 (the inverted signal of the latched data signal LCP(0)) is supplied to the gate of the transfer transistor 37.

The latched data signal LCP(1) is supplied to the first input terminal of a NAND gate 39 whose second input terminal is supplied with the output signal of the inverter circuit 35 via an inverter circuit 40.

The output signal of the NAND gate 39 is supplied to the gate of the transfer transistor 38 via an inverter circuit 41. The latched data signal LCP(2) is output as a comparison data signal CPD(1) via a transfer transistor 42 or output as a comparison data signal CPD(2) via a transfer transistor 60. The output signal of the NAND gate 39 is supplied to the gate of the transfer transistor 42.

The latched data signals LCP(3) to LCP(N) are output as comparison data signals CPD(3) to CPD(N) or output as comparison data signals CPD(2) to CPD(N-1). The latched data signal LCP(J0) is output as a comparison data signal CPD(N) via a transfer transistor 43.

In the second switch circuit 15, when all of the latched data signals LCP(0) to LCP(N) are at H levels, the latched data signals LCP(0) to LCP(N) are output as comparison data signals CPD(0) to CPD(N).

When only the latched data signal LCP(0) is at an L level, for example, the transfer transistor 34 is turned off and the transfer transistor 37 is turned on, causing the latched data signal LCP(1) to be output as the comparison data signal CPD(0). Further, the transfer transistor 38 is turned off and the transfer transistor 42 is turned on, causing the latched data signal LCP(2) to be output as the comparison data signal CPD(1).

By shifting the individual pieces of latched data one-by-one, the latched data signal LCP(n) is output as the comparison data signal CPD(n-1). Further, the latched data signal LCP(J0) is output as the comparison data signal CPD(N).

When only the latched data signal LCP(1) is at an L level, for example, the latched data signal LCP(0) is output as the comparison data signal CPD(0) and the latched data signals LCP(2) to LCP(N) are shifted one-by-one and are output as the comparison data signals CPD(1) to CPD(N-1). The latched data signal LCP(J0) is output as the comparison data signal CPD(N).

Figure 8:
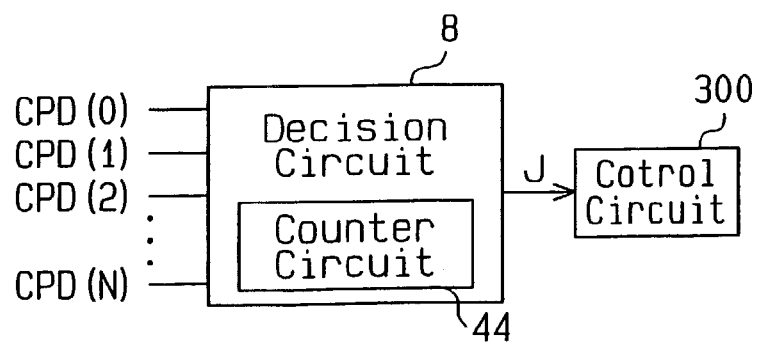
FIG. 8 is a schematic block diagram of a decision circuit in the BIST circuit of FIG. 2.

As shown in FIG. 8, the comparison data signals CPD(0) to CPD(N) are supplied to the decision circuit 8. The decision circuit 8 includes a counter circuit 44 which counts up by "1" every time the BIST circuit 3 finishes a single operational test on each memory cell array 4.

After performing the operational test (n+2) times, greater by "1" than the number of the redundant IO memory blocks J(0) to J(n), the decision circuit 8 determines whether each of the comparison data signals CPD(0) to CPD(N) is "1" or not. When not all of the comparison data signals CPD(0) to CPD(N) are "1", the decision circuit 8 supplies a decision result J indicating that the memory cell array 4 is defective to a control circuit 300 of the semiconductor chip 100.

The operations of the memory macros 1a and 1b will be explained below.

Figure 10:
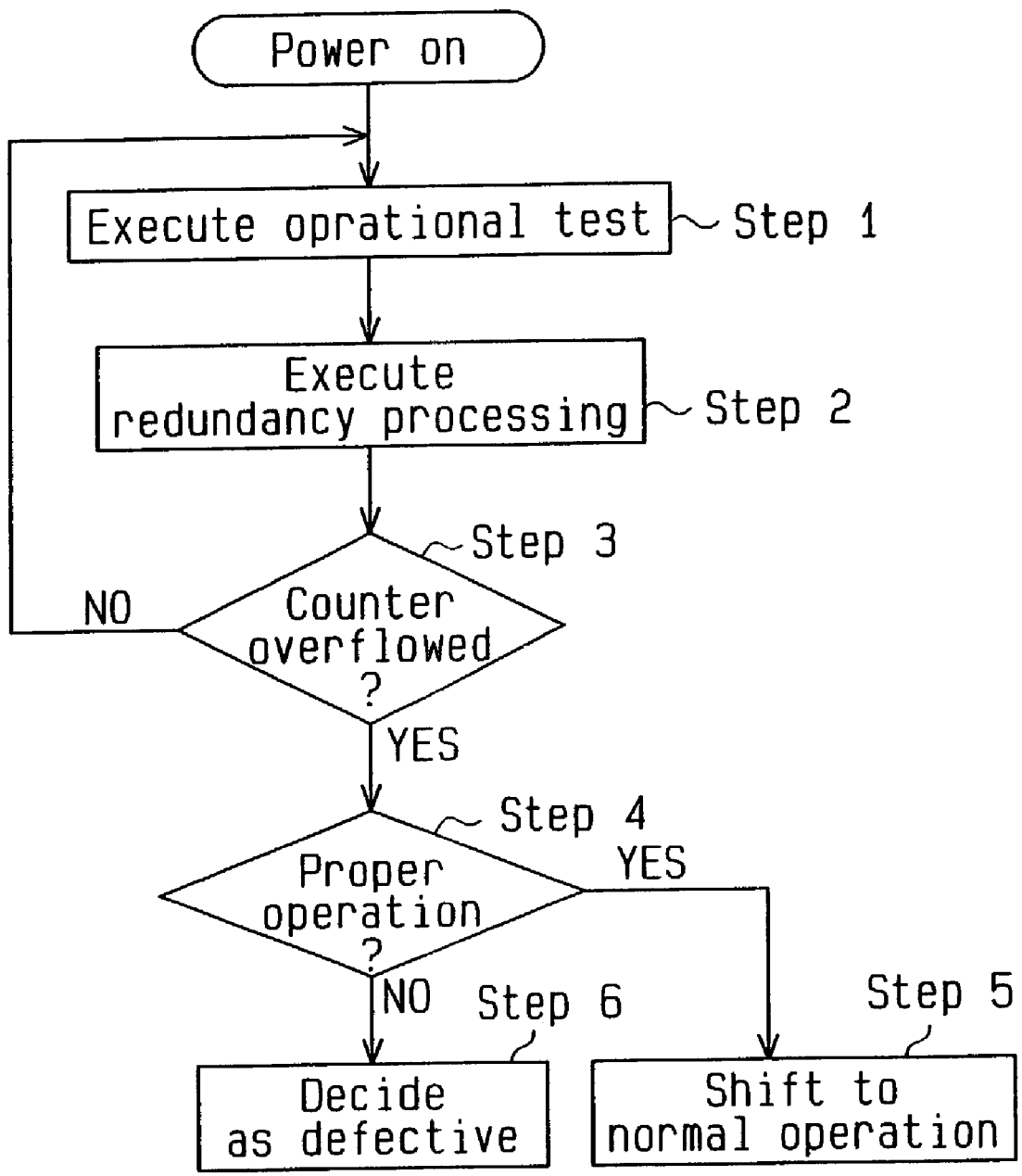
FIG. 10 is a flowchart for explaining the operation of the semiconductor memory device of FIG. 1.

As shown in FIG. 10, after power is provided, the BIST circuit 3 starts the first operational test on each of the memory macros 1a and 1b (step 1). At this time, the output signals CP(0) to CP(N) and CP(J0) to CP(Jn) are reset to H levels by the reset signal RS in the first switch circuit 14 of the data comparison circuit 7. The comparison data signals CPD(0) to CPD(N) in the second switch circuit 15 are reset to H levels.

When the operational test is initiated following the resetting operation, the BIST circuit 3 writes data in the individual memory cells in each of the IO memory blocks B(0) to B(N), then reads the written data.

The read data signals RDB(0) to RDB(N) respectively read from the IO memory blocks B(0) to B(N) are compared with the expected values TD(0) to TD(N) sequentially, and the comparison results SG0 to SGN are supplied to the first switch circuit 14. At this time, the H-level latched data signals LCP(0) to LCP(N) and LCP(J0) to LCP(Jn) are supplied to the first switch circuit 14 from the latch circuits LB(0) to LB(N) and LJ(0) to LJ(n). Therefore, the first switch circuit 14 outputs the comparison results SG0 to SGN as the output signals CP(0) to CP(N).

When the output signals CP(0) to CP(N) have H levels, the latch circuits LB(0) to LB(N) and LJ(0) to LJ(n) keep the latched signals that have been reset to H levels upon power-on. When the output signal CP(1) has an L level, the output signal of the NAND gate 27 is latched at an H level. At this time, the latched data signal LCP(1) is kept at an H level.

Figure 9:
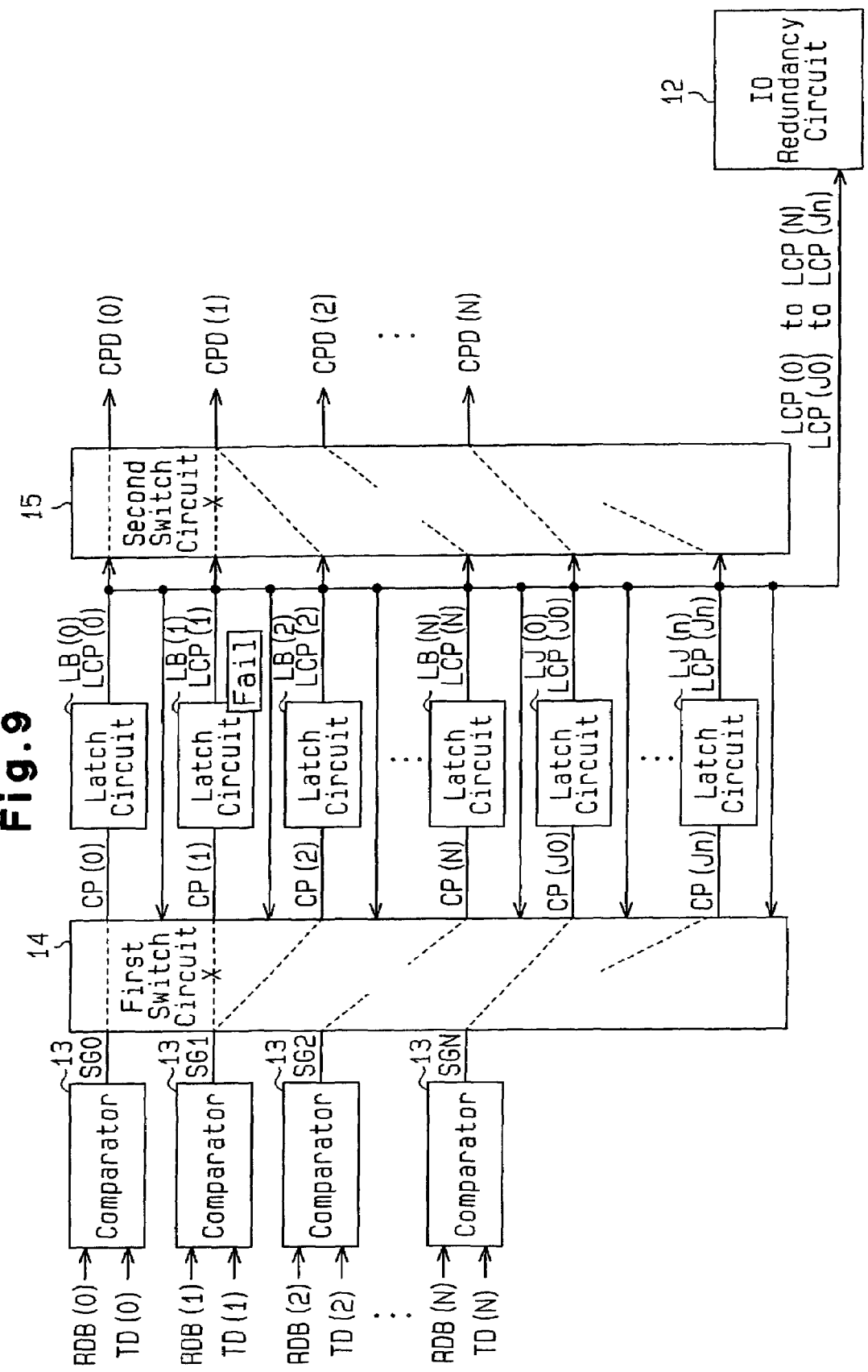
FIG. 9 is a schematic block diagram for explaining the operation of the data comparison circuit of FIG. 4.

When the BIST end signal BE rises to an H level after the first operational test is finished, the latched data signal LCP(1) alone is latched at an L level (indicated by "Fail" in FIG. 9) and the second switch circuit 15 outputs the H-level comparison data signals CPD(0) and CPD(2) to CPD(N) and the L-level comparison data signal CPD(1).

The latched data signals LCP(0) to LCP(N) and LCP(J0) to (Jn) are supplied to the IO redundancy circuit 12 and the first switch circuit 14 as well as the second switch circuit 15.

The IO redundancy circuit 12 performs a redundancy operation in accordance with the latched data signals LCP(0) to LCP(N) and LCP(J0) to (Jn) (step 2). When only the latched data signal LCP(1) is at an L level, for example, the IO redundancy circuit 12 switches the access to the IO memory block B(1) to an access to the redundant IO memory block J(0).

When all of the latched data signals LCP(0) to LCP(N) and LCP(J0) to (Jn) are at H levels in step 2, the IO redundancy circuit 12 does not perform the redundancy operation.

Then the decision circuit 8 determines whether the count value of the counter circuit 44 has overflowed or not (i.e., whether or not the count value has exceeded n+2 greater than n+1 which is the number of the redundant IO memory blocks). When the count value has not overflowed, the flow returns to step 1 to execute the second operational test (steps 2 and 3).

When only the latched data signal LCP(1) is at an L level, the first switch circuit 14 outputs the comparison result SG0 from the associated comparator 13 as the output signal CP(0). Further, the first switch circuit 14 shifts the output signals SG1 to SGN from the associated comparators 13 one-by-one and supplies the output signals CP(2) to CP(N) and CP(J0) to the latch circuits LB(2) to LB(N) and LJ(0), respectively. At this time, the latched data signal LCP(1) in the latch circuit LB(1) is kept at an L level.

The second switch circuit 15 outputs the latched data signal LCP(0) as the comparison data signal CPD(0). Further, the second switch circuit 15 shifts the latched data signals LCP(2) to LCP(J0) one-by-one and outputs the comparison data signals CPD(1) to CPD(N).

When any one of the comparison results SG0 to SGN newly falls to an L level, the associated latched data signal LCP is latched at an L level upon completion of the second operational test and the IO redundancy circuit 12 performs a new redundancy operation.

After such an operational test is performed n+2 times, the decision circuit 8 determines whether all of the comparison data signals CPD(0) to CPD(N) are at H levels or not (i.e., whether the memory cell array 4 is operating properly) (step 4).

When all of the comparison data signals CPD(0) to CPD(N) are at H levels, it is determined that the redundant IO memory block which has been selected in the redundancy operation is operating properly (i.e., the memory cell array 4 is good), and the control circuit 300 changes the operation mode to the normal operation mode from the test mode (step 5).

When any one of the comparison data signals CPD(0) to CPD(N) is at an L level, it is determined that any one of the selected redundancy IO memory blocks is not operating properly even though the redundancy operation performed (i.e., the memory cell array 4 is defective) (step 6).

The semiconductor memory device 100 according to the first embodiment has the following advantages.

(1) The BIST circuit 3 detects any defective IO memory block in the operational test and performs a self-redundancy operation to switch the defective IO memory block to a redundant IO memory block.

(2) When a defective IO memory block is detected, the operational test is repeatedly performed plural times while defect information is latched by the latch circuit of the defective IO memory block.

(3) In a case where n+2 operational tests have been conducted with respect to the number, n+1, of the redundant IO memory blocks and the test result obtained shows that all of the comparison data signals CPD(0) to CPD(N) are at H levels, it is determined that the memory cell array 4 is good. In other words, when any one of the comparison data signals CPD(0) to CPD(N) is at an L level after n+2 operational tests, it is determined that the memory cell array 4 is defective.

(4) The latch circuit in the data comparison circuit 7 which corresponds to a defective IO memory block latches the defect information and the IO redundancy circuit 12 in the memory cell array 4 performs a self-redundancy operation based on the latched defect information.

(5) The first and second switch circuits 14 and 15 of the data comparison circuit 7 supplies the decision circuit 8 with the comparison results latched in those latch circuits excluding the latch circuit that has latched the defect information as the comparison data signals CPD(0) to CPD(N).

(6) When the latch circuit corresponding to the defective IO memory block latches the defect information, the first and second switch circuits 14 and 15 shift the latch circuits one-by-one in order to avoid the latch circuit that has latched the defect information and transfer the comparison results in the next operational test.

(7) The latch circuits LB(0) to LB(N) and LJ(0) to LJ(n) latch defect information in accordance with the BIST end signal BE that is supplied every time a single operational test is finished.

(8) The data comparison circuit 7 which executes an operation to detect a defective IO memory block and a self-redundancy operation in parallel has a simple structure comprised of logic circuits and transfer transistors.

(9) No means, except the BIST circuit, such as memory means for storing failure information, a defect address generator, an address converter or a register, need be provided in a chip. This prevents the area of the semiconductor chip from increasing.

(10) There is no need for a data converting unit for generating redundant address data outside the semiconductor chip.

A semiconductor memory device according to a second embodiment of the present invention will be discussed below. The BIST circuit 3 of the semiconductor memory device according to the second embodiment determines whether the memory cell array 4 is good or defective every time it performs a single operational test. In a case where the memory cell array 4 is good, the operation mode is immediately shifted to the normal operation mode from the test mode. In contrast, the BIST circuit 3 of the semiconductor memory device 100 according to the first embodiment makes a decision on whether the memory cell array 4 is good or defective after n+2 operational tests are performed with respect to the number, n+1, of the redundant IO memory blocks J(0) to J(n).

Figure 11:
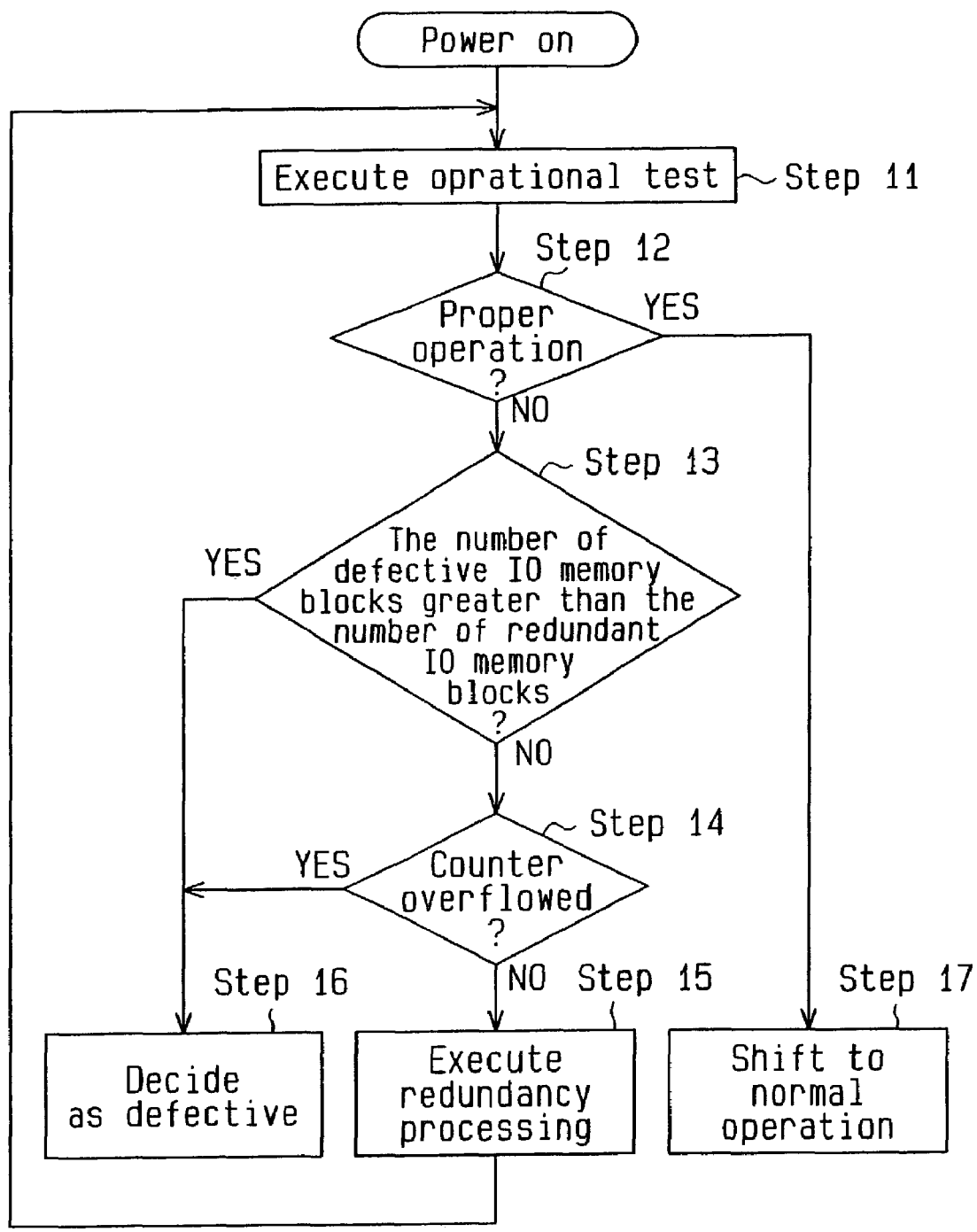
FIG. 11 is a flowchart for explaining the operation of a semiconductor memory device according to a second embodiment of the present invention.

The operation of the BIST circuit 3 according to the second embodiment will be discussed referring to FIG. 11.

After power is provided, the BIST circuit 3 starts the first operational test on each of the memory macros 1a and 1b (step 11). The BIST circuit 3 in the operational test mode operates in the same manner as the BIST circuit 3 of the first embodiment.

Next, the decision circuit 8 determines whether the memory cell array 4 is good or defective based on the comparison data signals CPD(0) to CPD(N) acquired in the first operational test (step 12).

When all of the comparison data signals CPD(0) to CPD(N) are at H levels, and a decision result J indicating that the memory cell array 4 is good is acquired, the BIST circuit 3 terminates the operational test and the control circuit 300 of the semiconductor chip 100 shifts the operation mode to the normal operation mode from the test mode (step 17).

When a comparison result showing that the memory cell array 4 is defective is obtained in step 12, the decision circuit 8 compares the number of the L-level comparison data signals CPD (i.e., the number of the IO memory blocks containing defective cells) with the number of the redundant IO memory blocks (step 13). If the number of the IO memory blocks containing defective cells exceeds the number of the redundant IO memory blocks, the decision circuit 8 immediately determines that the memory cell array 4 is defective and the BIST circuit 3 terminates the operational test based on that decision result (step 16).

If the number of the IO memory blocks containing defective cells does not exceed the number of the redundant IO memory blocks, the decision circuit 8 determines if the count value of the counter circuit 44 exceeds (n+2).

When the count value of the counter circuit 44 does not exceed (n+2), the IO redundancy circuit 12 performs a redundancy operation based on the latched data signals LCP(0) to LCP(N) and LCP(J0) to LCP(Jn) in the latch circuits (step 15). Then, the flow goes to step 11 to repeat the next operational test.

When the count value of the counter circuit 44 exceeds (n+2) in step 14, it is determined that the memory cell array 4 is defective (step 16).

The BIST circuit 3 according to the second embodiment has the following advantage.

In a case where it is determined as the result of the operational test that the memory cell array 4 is good, the operational test is terminated before (n+2) operational tests are performed with respect to n+1 redundancy systems.

Figure 12:
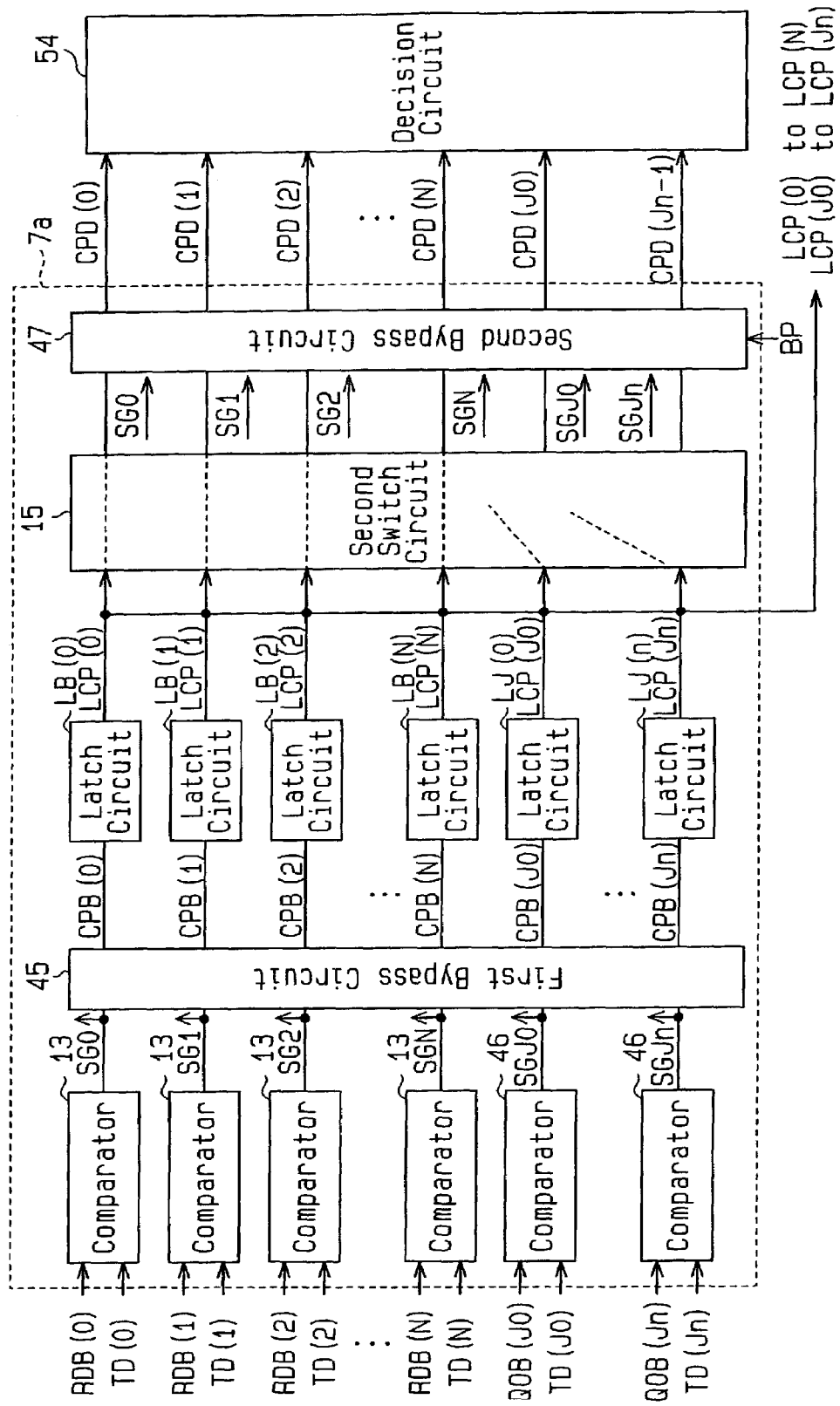
FIG. 12 is a schematic block diagram of a data comparison circuit in a BIST circuit of a semiconductor memory device according to a third embodiment of the present invention.

As shown in FIG. 12, the BIST circuit 3 of a semiconductor memory device according to a third embodiment of the present invention includes a data comparison circuit 7a. The data comparison circuit 7a includes the comparators 13, comparators 46, a first bypass circuit 45, the latch circuits LB(0) to LB(N) and LJ(0) to LJ(n), the second switch circuit 15 and a second bypass circuit 47.

The comparison results SG0 to SGN from the comparators 13 are respectively supplied to the latch circuits LB(0) to LB(N) via the first bypass circuit 45. The read data signals RDB(0) to RDB(N) are supplied to the respective comparators 13 from the associated memory blocks without going through the IO redundancy circuit 12.

The comparators 46 provided are equal in number to the redundant IO memory blocks J(0) to J(n). The individual comparators 46 receive read data signals QDB(J0) to QDB (Jn) from the redundant IO memory blocks J(0) to J(n) and expected value data signals TD(J0) to TD(Jn). The read data signals QDB(J0) to QDB(Jn) are supplied from the respective redundant IO memory blocks without passing the IO redundancy circuit 12. The expected value data signals TD(J0) to TD(Jn) are substantially identical to write data signals to be written in the redundant IO memory blocks J(0) to J(n) at the time of performing an operational test. In the third embodiment, data writing and reading to and from the IO memory blocks B(0) to B(N) and the redundant IO memory blocks J(0) to J(n) are performed at the time of an operational test.

Comparison results SGJ0 to SGJn from the respective comparators 46 are supplied to the respective latch circuits LJ(0) to LJ(n) via the first bypass circuit 45.

The latch circuits LB(0) to LB(N) and LJ(0) to LJ(n) supply the respective latched data signals LCP(0) to LCP(N) and LCP(J0) to (Jn) to the second switch circuit 15 and the IO redundancy circuit 12.

The output signal of the second switch circuit 15 is supplied to the second bypass circuit 47 which outputs the comparison data signals CPD(0) to CPD(N) and CPD(J0) to CPD(Jn). The second bypass circuit 47 is provided with the comparison results SG0 to SGN and SGJ0 to SGJn from the comparator 46.

Figure 14:
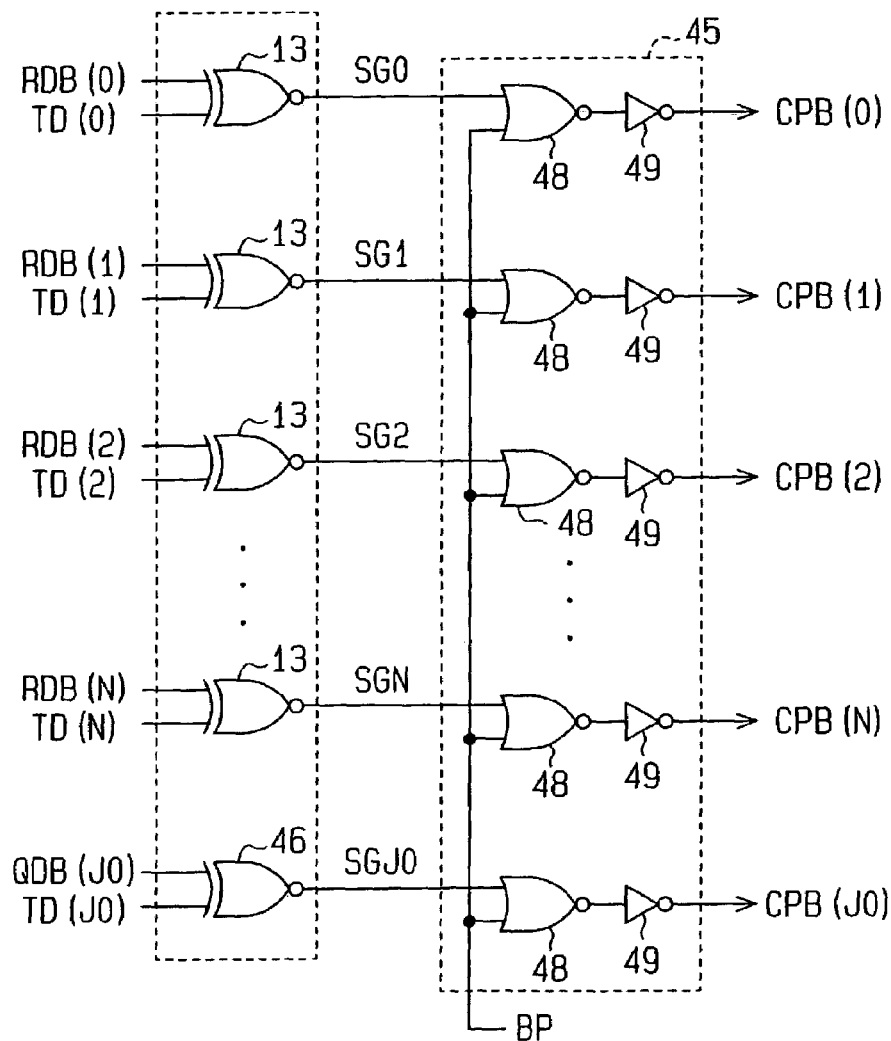
FIG. 14 is a schematic circuit diagram of a comparator and a first bypass circuit in the data comparison circuit of FIG. 12.
Figure 15:
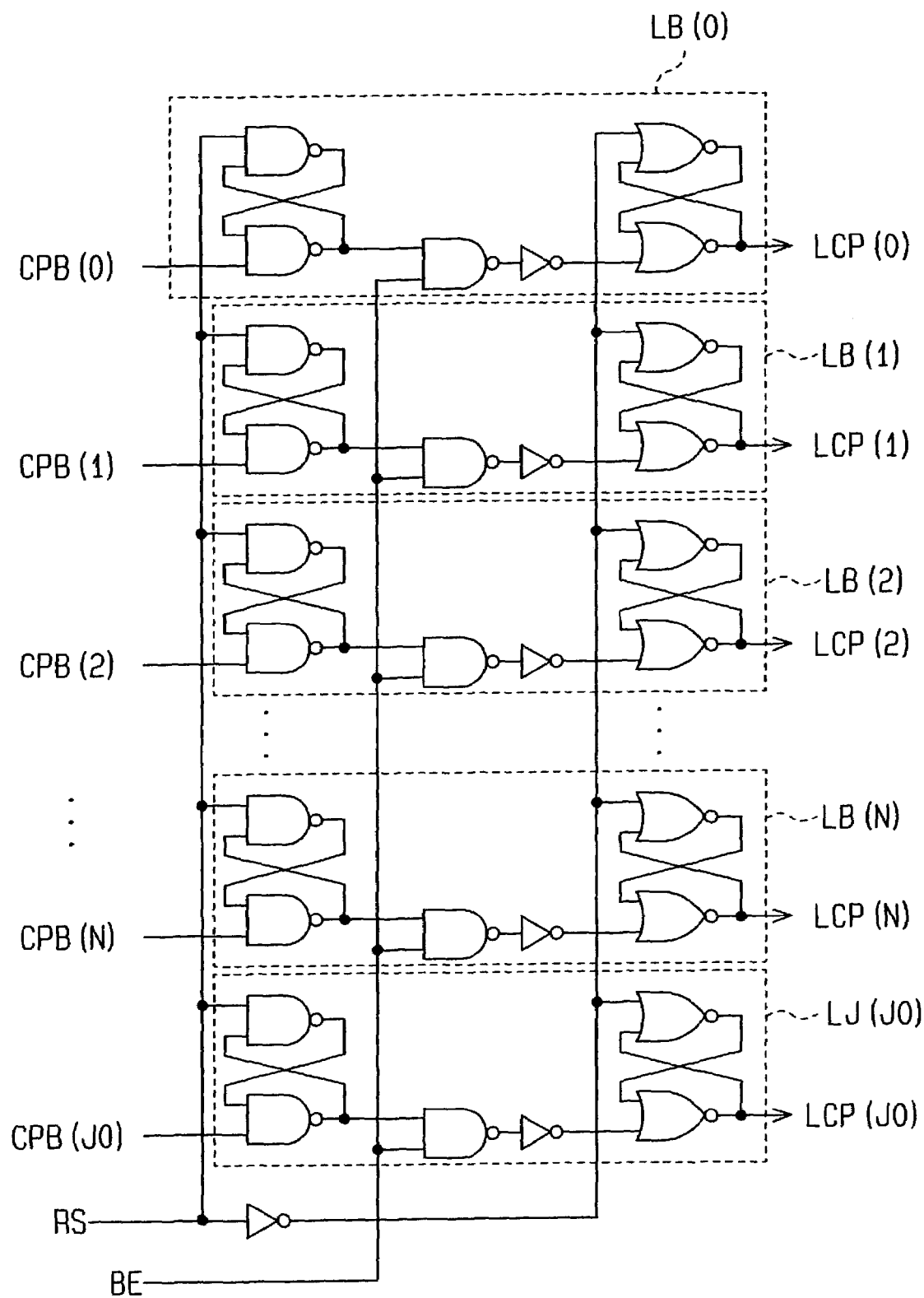
FIG. 15 is a schematic circuit diagram of a latch circuit in the data comparison circuit of FIG. 12.

FIG. 14 is a schematic circuit diagram of the comparators 13 and 46 and the first bypass circuit 45, and FIG. 15 is a schematic circuit diagram of the latch circuits LB(0) to LB(N) and LJ(0). Output signals CPB(0) to CPB(N) and CPB(J0) are respectively supplied to the latch circuits LB(0) to LB(N) and LJ(0). FIGS. 14 and 15 show the memory cell array 4 equipped with a single redundant IO memory block as per the first embodiment.

Each comparator 46 comprises an ENOR gate. The first bypass circuit 45 includes a plurality of NOR gates 48 which receive the comparison results SG0 to SGN and SGJ0 from the associated comparators 13 and 46, and a plurality of inverter circuits 49 which invert the output signals of the associated NOR gates 48.

A bypass signal BP is supplied to each NOR gate 48. The bypass signal BP is set to an L level in the first operational test and is set to an H level in the second operational test. When the bypass signal BP is at an L level, the output signals CPB(0) to CPB(N) and CPB(J0), which are the comparison results SG0 to SGN and SGJ0 from the comparators 13 and 46, are supplied to the latch circuits LB(0) to LB(N) and LJ(0) from the respective inverter circuits 49. When the bypass signal BP has an H level, the output signals CPB(0) to CPB(N) and CPB(J0) all having H levels are supplied to the latch circuits LB(0) to LB(N) and LJ(0), respectively. Therefore, in the second operational test, the levels of the latched data signals LCP(0) to LCP(N) and LCP(J0) in the first operational test are maintained.

As shown in FIG. 16, the second switch circuit 15 has the same structure as that of the first embodiment. The second bypass circuit 47 includes a plurality of logic circuit groups corresponding to the latched data signals LCP(0) to LCP(N) and LCP(J0) supplied from the second switch circuit 15. A description will now be given of the logic circuit group that receives the latched data signal LCP(0) or latched data signal LCP(1), which is the output of the second switch circuit 15.

The output signal of the second switch circuit 15 is supplied to the first input terminal of a NAND gate 50 whose second input terminal is supplied with the bypass signal BP via an inverter circuit 51. The comparison result SG0 is supplied to the first input terminal of an NAND gate 52 from the associated comparator 13 and the bypass signal BP is supplied to the second input terminal of the NAND gate 52. The output signals of the NAND gates 50 and 52 are supplied to the first and second input terminals of a NAND gate 53 which outputs the comparison data signal CPD(0) from its output terminal.

In the logic circuit group, when the bypass signal BP is at an L level, the output signal of the NAND gate 52 is fixed to an H level. Therefore, the output signal of the second switch circuit 15 is output as the comparison data signal CPD(0) via the NAND gates 50 and 53. When the bypass signal BP is at an H level, on the other hand, the output signal of the NAND gate 50 is fixed to an H level. Therefore, the output signal of the second switch circuit 15 is output as the comparison data signal CPD(0) via the NAND gates 52 and 53. Therefore, when the bypass signal BP has an H level, the comparison results SG0 to SGN and SGJ0 are bypassed to the second bypass circuit 47 without passing the latch circuits LB(0) to LB(N) and LJ(0) and the second switch circuit 15, and the comparison data signals CPD(0) to CPD(N) are output from the second bypass circuit 47.

Figure 13:
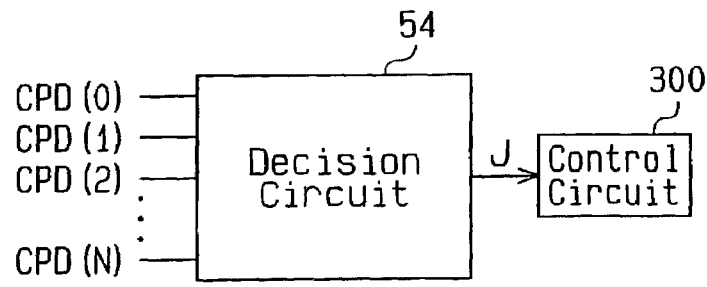
FIG. 13 is a schematic block diagram of a decision circuit in the BIST circuit of a semiconductor memory device according to the third embodiment of the present invention.

A decision circuit 54 shown in FIG. 13 does not have the counter circuit 44 of the decision circuit 8 according to the second embodiment.

The operation of memory macros will be discussed below referring to FIG. 17.

After power is provided, the BIST circuit 3 starts the first operational test on each of the memory macros 1a and 1b (step 21). At this time, data is written in and read from the IO memory blocks B(0) to B(N) and the redundant IO memory blocks J(0) to J(n).

Plural pieces of read data read out from the IO memory blocks B(0) to B(N) and the redundant IO memory blocks J(0) to J(n) are compared in the comparators 13 and 46, and the comparison results SG0 to SGN and SGJ0 to SGJn are supplied to the first bypass circuit 45. As the L-level bypass signal BP is supplied to the first bypass circuit 45 at this time, the output signals CPB(0) to CPB(N) and CPB(J0) to CPB(Jn) are respectively supplied to the latch circuits LB(0) to LB(N) and LJ(0) to LJ(n) from the first bypass circuit 45.

All of the latched data signals LCP(0) to LCP(N) and LCP(J0) to (Jn) in the latch circuits LB(0) to LB(N) and LJ(0) to LJ(n) are reset to H levels by the reset signal RS. Further, the L-level bypass signal BP is supplied to the second bypass circuit 47. Therefore, the second bypass circuit 47 outputs the comparison data signals CPD(0) to CPD(N) and CPD(J0) to CPD(Jn) as all having H levels.

When the first operational test is finished and the BIST end signal BE is set to an H level, the comparison results SG0 to SGN and SGJ0 are respectively latched in the latch circuits LB(0) to LB(N) and LJ(0) to LJ(n). The latched data signals LCP(0) to LCP(N) and LCP(J0) to (Jn) in the latch circuits LB(0) to LB(N) and LJ(0) to LJ(n) are supplied to the second switch circuit 15 and the IO redundancy circuit 12.

The second switch circuit 15 shifts the latched data signals LCP in such that L-level latched data signals LCP are not output as the comparison data signals CPD. The second bypass circuit 47 outputs the shifted latched data signals LCP as the comparison data signals CPD(0) to CPD(N).

Next, the comparison data signals CPD(0) to CPD(N) are supplied to the decision circuit 54 which in turn performs a decision operation (step 22). Specifically, if all of the comparison data signals CPD(0) to CPD(N) have H levels because of the shift operation performed by the second switch circuit 15, the decision circuit 54 outputs the decision result J indicating that the memory cell array 4 is good.

Then, the IO redundancy circuit 12 performs a redundancy operation based on the latched data signals LCP(0) to LCP(N) and LCP(J0) to (Jn) (step 23) and the operation mode is shifted to the normal operation mode from the test mode (step 24).

In a case where not all of the comparison data signals CPD(0) to CPD(N) have H levels in step 22 (i.e., when the number of the defective IO memory blocks is greater than the number of the redundant IO memory blocks), the decision circuit 54 decides that the memory cell array 4 is defective and terminates the operation (step 25).

In the third embodiment, the operational test is performed only once and when the redundancy operation is possible, it is determined that the memory cell array 4 is good and the operation mode is shifted to the normal operation mode from the test mode. Unlike in the first embodiment, therefore, after a defective IO memory block is replaced with a redundant IO memory block, the operational test is not carried out repeatedly.

In a case where an operational test is to be performed for a new redundancy path, the bypass signal BP is set to an H level after the above-described first operational test is finished, and the second operational test is then carried out. The read data signals from the N+1 memory blocks after the redundancy operation are supplied to the respective comparators 13 and 46 and the comparison results are supplied to the second bypass circuit 47. The second bypass circuit 47 outputs the comparison results as the comparison data signals CPD(0) to CPD(N). The decision circuit 54 determines whether or not all of the comparison data signals CPD(0) to CPD(N) have H levels to decide if the memory cell array after the redundancy operation is good.

It should be apparent to those skilled in the art that the present invention may be embodied in many other specific forms without departing from the spirit or scope of the invention. Particularly, it should be understood that the invention may be embodied in the following forms.

The BIST circuit 3 may start an operational test upon reception of not only the reset signal RS but also a BIST control signal.

After conducting an operational test accompanied with a redundancy operation, the BIST circuit 3 may perform a new operational test in the following manner. The BIST circuit 3 does not perform a new redundancy operation but performs a new operational test in response to the BIST control signal while holding the redundancy operation results that have already been set. That is, in the third embodiment, as the bypass signal BP is supplied to the first and second bypass circuits 45 and 47, the comparison results are supplied to the second bypass circuit 47. It is therefore possible to perform an operational test with the redundancy operation results held in the respective latch circuits LB(0) to LB(N) and LJ(0) to LJ(n). Such an operational test is suitable for a voltage margin test which is carried out at the time semiconductor memory devices are shipped.

An operational test may be performed by using the BIST control signal at the time an ASIC chip is actually used. In this case, a redundancy operation is performed on defects which are newly detected at the time of actual usage.

Therefore, the present examples and embodiments are to be considered as illustrative and not restrictive and the invention is not to be limited to the details given herein, but may be modified within the scope and equivalence of the appended claims.

What is claimed is:

1. A testing circuit for self-testing a memory cell array including a normal memory block and a redundant memory block, the testing circuit comprising:
    a comparison circuit for comparing write data to the memory cell array with read data from the memory cell array and generating a comparison result signal;
    a decision circuit for deciding if the memory cell array is good or defective based on the comparison result signal from the comparison circuit; and
    a signal transfer and holding circuit, connected between the comparison circuit and the decision circuit, for transferring the comparison result signal to the decision circuit and holding the comparison result signal, wherein the signal transfer and holding circuit invalidates the comparison result signal, which indicates the write data not matching with the read data, and switching a comparison result signal corresponding to the normal memory block to a comparison result signal corresponding to the redundant memory block.

2. The testing circuit according to claim 1, wherein the comparison circuit is one of a plurality of comparison circuits, and the signal transfer and holding circuit includes:
    a plurality of holding circuits for each holding the comparison result signal from an associated comparison circuit; and
    a first switch circuit, connected between the plurality of comparison circuits and the plurality of holding circuits, for supplying a plurality of comparison result signals from the plurality of comparison circuits to the plurality of holding circuits, and for receiving the plurality of comparison result signals from the plurality of holding circuits and for supplying at least one comparison result signal another holding circuit other than a corresponding holding circuit, when the at least one comparison result signal indicates the write data not matching with the read data.

3. The testing circuit according to claim 2, wherein the memory cell array includes a normal memory block and a redundant memory block, and the signal transfer and holding circuit further includes:
    a second switch circuit, connected to the plurality of holding circuits, for receiving the plurality of comparison result signals from the plurality of holding circuits and when the comparison result signal corresponding to the normal memory block indicates write data not matching with read data, transferring the comparison result signal corresponding to the redundant memory block, instead of the comparison result signal corresponding to the normal memory block.

4. The testing circuit according to claim 1, wherein the memory cell array includes a normal memory block and a redundant memory block, the comparison circuit includes a comparison unit corresponding to the normal memory block and a comparison unit corresponding to the redundant memory block, and the signal transfer and holding circuit includes:
    a plurality of holding circuits for each holding the comparison result signal from an associated comparison circuit; and
    a switch circuit, connected to the plurality of holding circuits, for receiving the plurality of comparison result signals from the plurality of holding circuits and, when the comparison result signal corresponding to the normal memory block indicates write data not matching with read data, transferring the comparison result signal corresponding to the redundant memory block, instead of the comparison result signal corresponding to the normal memory block.

5. The testing circuit according to claim 4, wherein the signal transfer and holding circuit further includes:
    a first bypass circuit, connected between the plurality of comparison circuits and the plurality of holding circuits, for receiving the plurality of comparison result signals from the plurality of comparison units and selectively supplying the plurality of comparison result signals to the plurality of holding circuits in response to a control signal; and
    a second bypass circuit, connected to the switch circuit, the plurality of comparison units and the decision circuit, for supplying the plurality of comparison result signals to the plurality of comparison units or the plurality of comparison result signals transferred from the switch circuit to the decision circuit in response to the control signal.

6. A testing circuit for self-testing a semiconductor memory device, wherein the semiconductor memory device includes a normal memory block and a redundant memory block, each of which performs data writing and data reading, the testing circuit comprising:
    a plurality of comparison circuits for each comparing data read from an associated memory block with write data to the associated memory block and generating a comparison result signal;
    a plurality of holding circuits for each holding the comparison result signal from the associated comparison circuit;
    a first switch circuit, connected between the plurality of comparison circuits and the plurality of holding circuits, for supplying a plurality of comparison result signals from the plurality of comparison circuits to the plurality of holding circuits, and for receiving the plurality of comparison result signals from the plurality of holding circuits, and for supplying at least one comparison result signal to another holding circuit other than a corresponding holding circuit, when the at least one comparison result signal indicates the write data not matching with the read data; and a second switch circuit, connected to the plurality of holding circuits, for selectively outputting the plurality of comparison result signals held in the plurality of holding circuits, wherein the second switch circuit invalidates the comparison result signal, which indicates the write data not matching with the read data, and switching a comparison result signal corresponding to the normal memory block to a comparison result signal corresponding to the redundant memory block.

7. A testing circuit for self-testing a semiconductor memory device, wherein the semiconductor memory device includes a normal memory block and a redundant memory block, each of which performs data writing and data reading, the testing circuit comprising:

a plurality of comparison circuits for each comparing data read from an associated memory block with write data to the associated memory block and generating a comparison result signal;

a plurality of holding circuits for each holding the comparison result signal from the associated comparison circuit;

a first bypass circuit, connected between the plurality of comparison circuits and the plurality of holding circuits, for receiving the plurality of comparison result signals from the plurality of comparison circuits and selectively supplying the plurality of comparison result signals to the plurality of holding circuits in response to a control signal;

a switch circuit, connected to the plurality of holding circuits, for selectively outputting the plurality of comparison result signals held in the plurality of holding circuits; and a second bypass circuit, connected to the switch circuit and the plurality of comparison circuits, for transferring the plurality of comparison result signals to the plurality of comparison circuits or the plurality of comparison result signals output from the switch circuit to the decision circuit in response to the control signal, wherein the switch circuit invalidates the comparison result signal, which indicates the write data not matching with the read data, and switching a comparison result signal corresponding to the normal memory block to a comparison result signal corresponding to the redundant memory block.

8. A semiconductor memory device comprising:

a memory cell array including a normal memory block and a redundant memory block;

a self-testing circuit for testing each of the memory blocks; and a redundancy circuit for switching the normal memory block, if found defective based on a test result from the self-testing circuit, to the redundant memory block, the self-testing circuit including:

a comparison circuit for comparing write data to the normal memory block with read data from the normal memory block, comparing write data to the redundant memory block with read data from the redundant memory block, and generating a plurality of comparison result signals, a decision circuit for deciding if the memory cell array is good or defective based on the plurality of comparison result signals from the comparison circuit, and a signal transfer and holding circuit, connected between the comparison circuit and the decision circuit, for transferring the plurality of comparison result signals to the decision circuit and supplying the plurality of comparison result signals to the redundancy circuit as a test result, wherein the signal transfer and holding circuit invalidates the comparison result signal, which indicates the write data not matching with the read data, and switching a comparison result signal corresponding to the normal memory block to a comparison result signal corresponding to the redundant memory block.

9. The semiconductor memory device according to claim 8, wherein the signal transfer and holding circuit includes:

a plurality of holding circuits for each holding the associated comparison result signal from the comparison circuit; and a first switch circuit, connected to the plurality of holding circuits, for receiving the plurality of comparison result signals from the plurality of holding circuits, and for supplying at least one comparison result signal to another holding circuit other than a corresponding holding circuit, when the at least one comparison result signal indicates the write data not matching with the read data.

10. The semiconductor memory device according to claim 9, wherein the first switch circuit supplies a plurality of new comparison result signals to the other holding circuits by shifting the plurality of new comparison result signals including a new comparison result signal corresponding to the at least one comparison result signal.

11. The semiconductor memory device according to claim 9, wherein the signal transfer and holding circuit further includes:

a second switch circuit, connected to the plurality of holding circuits, for receiving the plurality of comparison result signals from the plurality of holding circuits and, when the comparison result signal corresponding to the normal memory block indicates write data not matching with read data, transferring the comparison result signal corresponding to the redundant memory block, instead of the comparison result signal corresponding to the normal memory block.

12. The semiconductor memory device according to claim 11, wherein the decision circuit has a counter circuit for counting a number of tests, the self-testing circuit repeats a test until the number of tests exceeds a number of the redundant memory blocks by 1, and the decision circuit decides if the memory cell array is good or defective after the test is completed.

13. The semiconductor memory device according to claim 11, wherein each of the holding circuits holds the associated comparison result signal in response to an end signal indicating that a single test has been finished.

14. The semiconductor memory device according to claim 11, wherein each time the self-testing circuit performs a single test, the decision circuit decides if the memory cell array is good or defective, and the self-testing circuit terminates an operational test when the decision circuit has decided that the memory cell array is good.

15. The semiconductor memory device according to claim 14, wherein the decision circuit determines whether or not a number of defective memory blocks has exceeded a number of the redundant memory blocks, and the self-testing circuit terminates an operational test when the number of defective memory blocks has exceeded the number of the redundant memory blocks.

16. The semiconductor memory device according to claim 8, wherein the signal transfer and holding circuit includes:
a plurality of holding circuits for each holding an associated comparison result signal from the comparison circuit; and
a switch circuit, connected to the plurality of holding circuits, for receiving the plurality of comparison result signals from the plurality of holding circuits and, when the comparison result signal corresponding to the normal memory block indicates write data not matching with read data, transferring the comparison result signal corresponding to the redundant memory block, instead of the comparison result signal corresponding to the normal memory block.

17. The semiconductor memory device according to claim 16, wherein the signal transfer and holding circuit further includes:
a plurality of comparison circuits corresponding to the normal memory block and the redundant memory block;
a first bypass circuit, connected between the plurality of comparison circuits and the plurality of holding circuits, for receiving the plurality of comparison result signals from the plurality of comparison circuits and selectively supplying the plurality of comparison result signals to the plurality of holding circuits in response to a control signal; and
a second bypass circuit, connected to the switch circuit, the plurality of comparison circuits and the decision circuit, for supplying the plurality of comparison result signals to the plurality of comparison circuits or the plurality of comparison result signals transferred from the switch circuit to the decision circuit in response to the control signal.

18. A semiconductor memory device comprising:
a normal memory block and a redundant memory block, each of which performs data writing and data reading;
a plurality of comparison circuits for each comparing data read from an associated memory block with write data to the associated memory block and generating a comparison result signal;
a plurality of holding circuits for each holding the comparison result signal from the associated comparison circuit; and
a switch circuit, connected to the plurality of holding circuits, for selectively transferring the plurality of comparison result signals held in the plurality of holding circuits, wherein the switch circuit invalidates the comparison result signal, which indicates the write data not matching with the read data, and switching a comparison result signal corresponding to the normal memory block to a comparison result signal corresponding to the redundant memory block.

19. A method for performing self-testing of a semiconductor memory device, wherein the semiconductor memory device includes a normal memory block and a redundant memory block, each of which performs data writing and data reading, the method comprising the steps of:
comparing data read from each memory block with write data to each memory block and generating a plurality of comparison result signals;
transferring the plurality of comparison result signals to a decision circuit which decides if the semiconductor memory device is good or defective;
holding the plurality of comparison result signals;
invalidating the comparison result signal, which indicates the write data not matching with the read data; and
switching a comparison result signal corresponding to the normal memory block to a comparison result signal corresponding to the redundant memory block.

* * * * *